US012796526B2

(12) United States Patent
Poddar et al.

(10) Patent No.: US 12,796,526 B2
(45) Date of Patent: Nov. 10, 2026

(54) DIE ISOLATION WITH CONFORMAL COATING

(71) Applicant: Texas Instruments Incorporated, Dallas, TX (US)

(72) Inventors: Anindya Poddar, Sunnyvale, CA (US); Daiki Komatsu, Beppu (JP); Hau Nguyen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 569 days.

(21) Appl. No.: 18/309,546

(22) Filed: Apr. 28, 2023

(65) Prior Publication Data

US 2024/0363465 A1 Oct. 31, 2024

(51) Int. Cl.

| | |
|---|---|
| ***H10W 74/10*** | (2026.01) |
| ***H10P 54/00*** | (2026.01) |
| ***H10W 70/40*** | (2026.01) |
| ***H10W 74/01*** | (2026.01) |
| *H10W 72/00* | (2026.01) |
| *H10W 72/50* | (2026.01) |
| *H10W 72/90* | (2026.01) |
| *H10W 74/43* | (2026.01) |
| *H10W 74/47* | (2026.01) |
| *H10W 90/00* | (2026.01) |

(52) U.S. Cl.

CPC ........... *H10W 74/121* (2026.01); *H10P 54/00* (2026.01); *H10W 70/417* (2026.01); *H10W 74/014* (2026.01); *H10W 72/073* (2026.01); *H10W 72/075* (2026.01); *H10W 72/5449* (2026.01); *H10W 72/884* (2026.01); *H10W 72/934* (2026.01); *H10W 72/953* (2026.01); *H10W 74/019* (2026.01); *H10W 74/43* (2026.01); *H10W 74/47* (2026.01); *H10W 90/736* (2026.01); *H10W 90/756* (2026.01)

(58) Field of Classification Search

None

See application file for complete search history.

(56) References Cited

U.S. PATENT DOCUMENTS

2004/0245652 A1* 12/2004 Ogata ..................... H01L 24/05 257/E21.705

2006/0246642 A1* 11/2006 Veeramma ........... H10D 64/112 257/E29.328

(Continued)

FOREIGN PATENT DOCUMENTS

KR 20210045597 * 4/2021

OTHER PUBLICATIONS

Henkel Loctite Ablestik 8006NS Datasheet (Year: 2014).*
Henkel (Year: 2014).*

*Primary Examiner* — Mohammad M Choudhry

(74) *Attorney, Agent, or Firm* — Ronald O. Neerings; Charles F. Koch

(57) ABSTRACT

An electronic device includes a semiconductor die, a die attach pad, an adhesive, a conductive lead, and a package structure, where the semiconductor die has opposite first and second sides, a conductive terminal on the second side, and an electrical isolation coating layer that extends on the first side, the adhesive adheres the first side of the semiconductor die to the die attach pad, the conductive lead is electrically coupled to the conductive terminal of the semiconductor die, and the package structure encloses at least a portion of the semiconductor die.

20 Claims, 41 Drawing Sheets

(56) References Cited

U.S. PATENT DOCUMENTS

| | | | | |
|---|---|---|---|---|
| 2011/0147919 | A1* | 6/2011 | Sutardja | H01L 24/17 257/E23.101 |
| 2012/0241928 | A1* | 9/2012 | Tay | H01L 24/73 257/E21.511 |
| 2019/0131406 | A1* | 5/2019 | Ciavatti | H10D 62/393 |
| 2019/0259685 | A1* | 8/2019 | Hussain | H01L 23/49575 |

* cited by examiner

DIE ISOLATION WITH CONFORMAL COATING

BACKGROUND

Voltage isolation and heat dissipation are important performance metrics for single component electronic devices or multiple component electronic devices such as integrated circuits. Electrical isolation between circuitry of a semiconductor die and a die attach pad can determine the operating voltage rating of an electronic device without dielectric breakdown and conduction of breakdown current. Good thermal performance can facilitate increased power density of electronic devices without package delamination. Single die devices can suffer from voltage breakdown between circuitry at the top side of the die and a die attach pad exposed along the bottom of the packaged electronic device. High voltage isolation can be addressed by stacked die configurations, but this increases manufacturing cost and increases the package size. The bottom side of a die attach pad can be enclosed by molding compound, but this reduces thermal performance and increases manufacturing cost.

SUMMARY

In one aspect, an electronic device includes a semiconductor die having opposite first and second sides, a conductive terminal on the second side, and an electrical isolation coating layer that extends on the first side, a die attach pad, an adhesive that adheres the first side of the semiconductor die to the die attach pad, a conductive lead electrically coupled to the conductive terminal of the semiconductor die, and a package structure that encloses at least a portion of the semiconductor die.

In another aspect, a system includes a circuit board and an electronic device having a die attach pad, a conductive lead, a semiconductor die, an adhesive, and a package structure. The semiconductor die has opposite first and second sides, a conductive terminal on the second side, and an electrical isolation coating layer that extends on the first side. The adhesive adheres the first side of the semiconductor die to the die attach pad, the conductive lead is electrically coupled to the conductive terminal of the semiconductor die and to a conductive feature of the circuit board, and the package structure encloses at least a portion of the semiconductor die.

In a further aspect, a method of fabricating an electronic device includes forming trenches in a first side of a wafer, forming an electrical isolation coating layer on the first side and in the trenches, and separating a semiconductor die from the wafer, where the semiconductor die has a portion of the first side, an opposite second side, a conductive terminal on the second side, a lateral sidewall that extends between the first and second sides, an indent that extends into a portion of the lateral sidewall and to the portion of the first side, and a portion of the electrical isolation coating layer that extends along the indent and on the portion of the first side.

DETAILED DESCRIPTION

Figure 1:
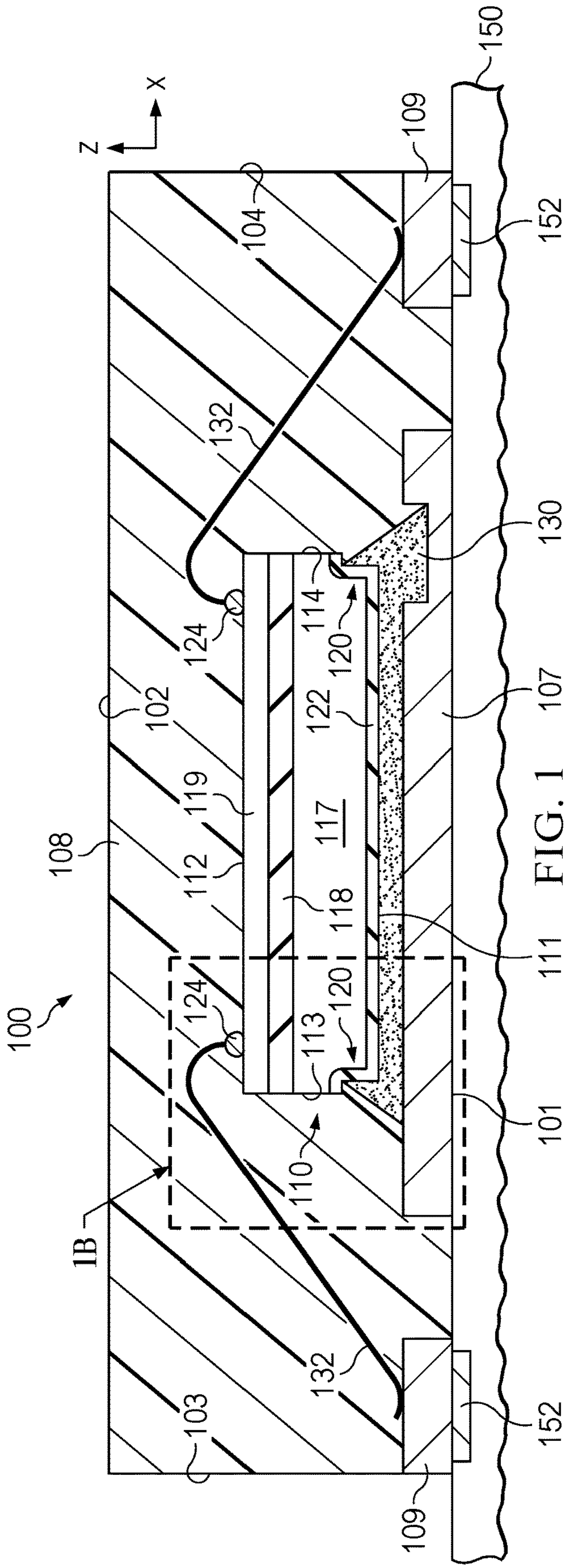
FIG. 1 is a sectional side elevation view of an electronic device with an electrical isolation coating layer conformally formed on a back or bottom side and in an indented portion of a lateral sidewall of a semiconductor die taken along line 1-1 of FIG. 1A.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about." "approximately." or "substantially" preceding a value means +/−10 percent of the stated value.

Electronic devices and systems and methods for making the same are described in which conformal electrical isolation coatings are provided on a semiconductor die back side to enhance voltage isolation in packaged electronic devices. The conformal coatings in certain examples can facilitate device thermal performance and certain implementations provide isolation solutions for compact packaged electronic device designs with little or no increase in manufacturing cost. In certain examples, a conformal electrical isolation coating is applied to a semiconductor wafer backside and into backside trenches during wafer fabrication to provide a backside and lateral sidewall isolation coating layer in subsequently separated semiconductor dies that can be packaged to produce compact packaged electronic devices with enhanced electrical isolation and/or thermal performance properties.

Figure 1A:
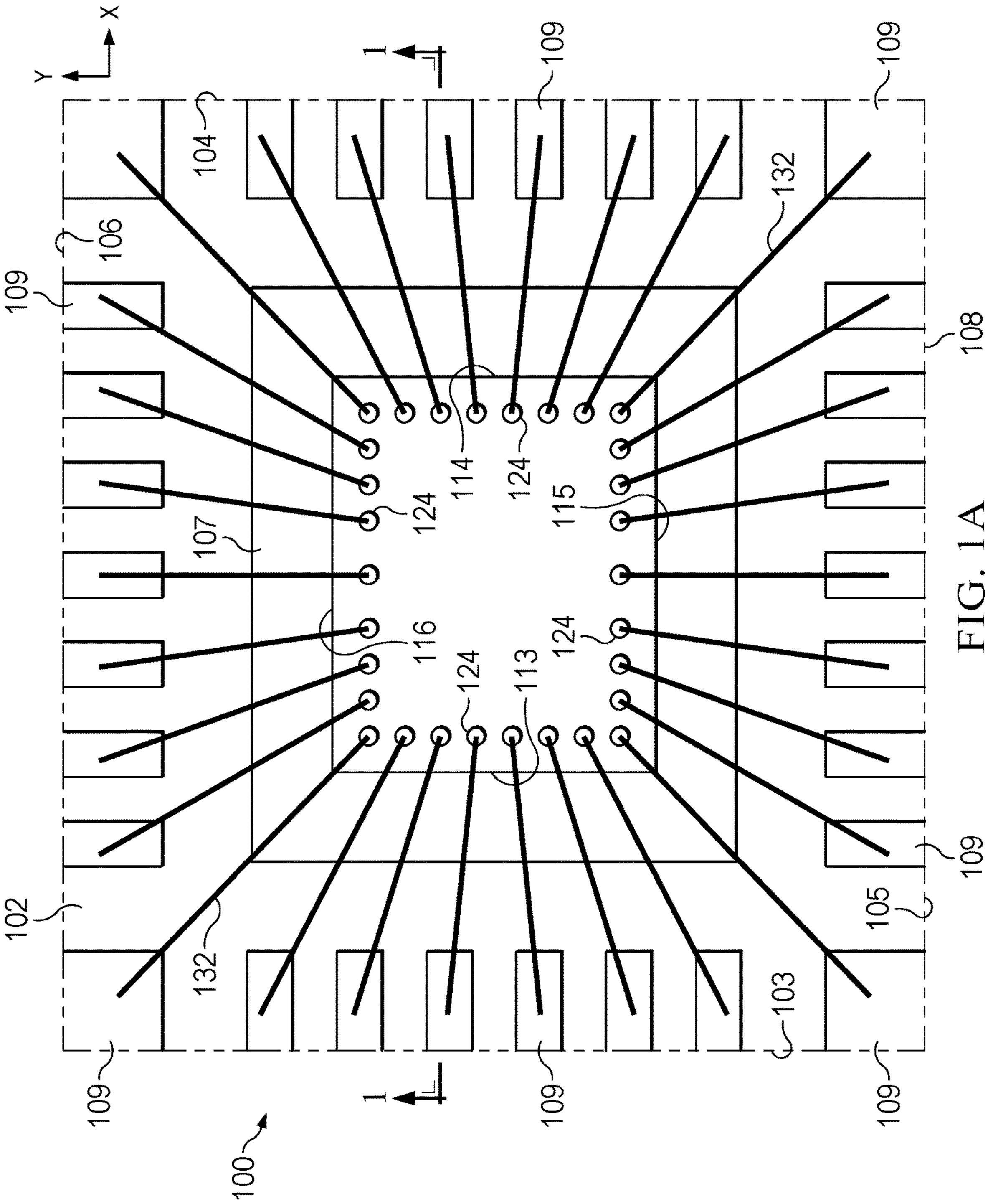
FIG. 1A is a top plan view of the electronic device of FIG. 1.
Figure 1B:
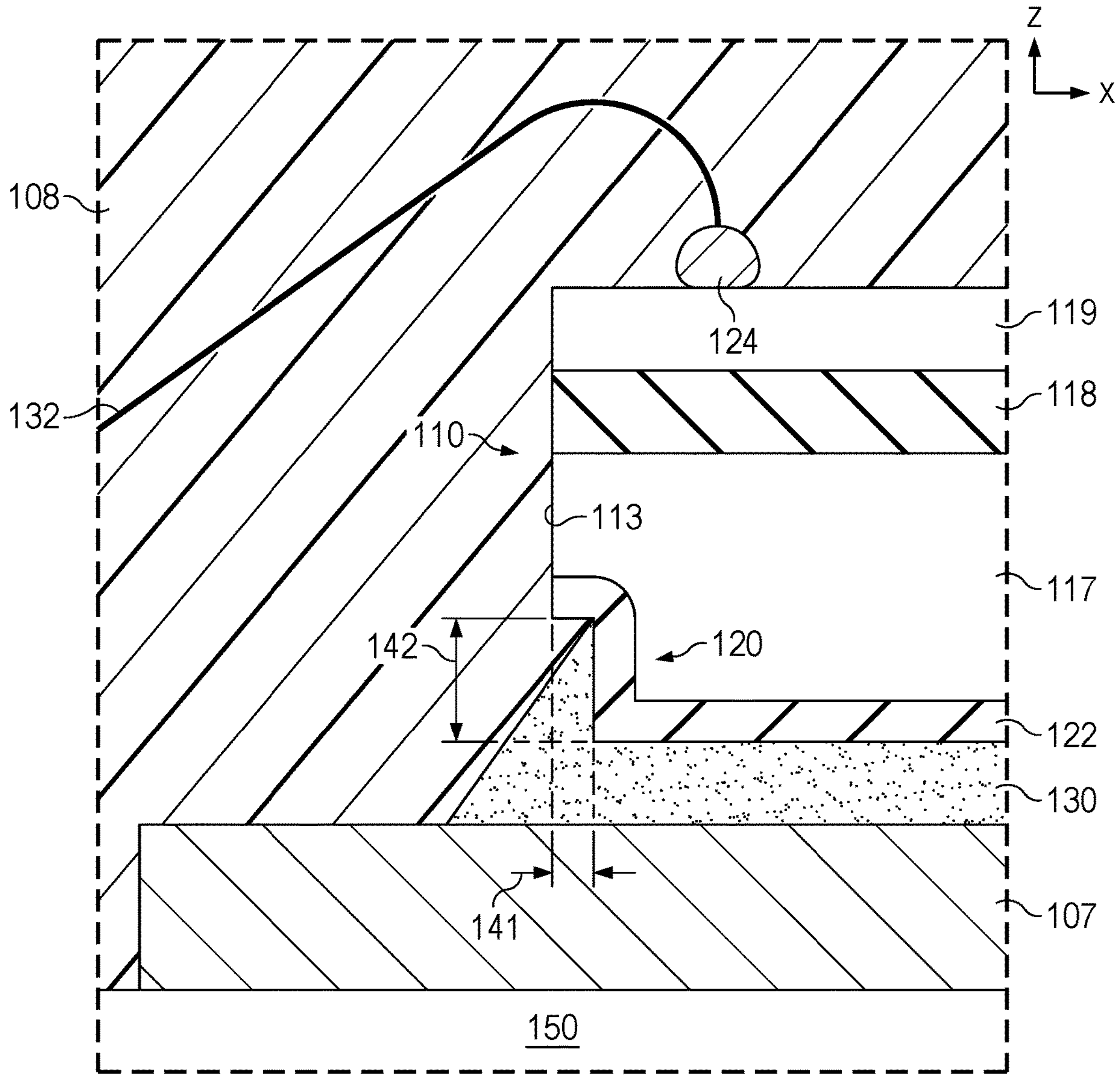
FIG. 1B is a partial sectional side elevation view showing further details of a side of the semiconductor die and conformal electrical isolation coating layer in the electronic device of FIGS. 1 and 1A.

FIGS. 1-1B show an example electronic device 100, such as an integrated circuit or a single component electronic device. FIG. 1A shows a top view of the electronic device 100, FIG. 1 shows a sectional side view of the electronic device 100 taken along line 1-1 of FIG. 1A and FIG. 1B shows a partial side view that illustrates further details of the electronic device 100. FIG. 1 shows the electronic device 100 installed in an example system, such as a smart phone, laptop or desktop computer, a tablet, an automotive system, an industrial system, etc. The electronic device 100 is shown in an example position or orientation in a three-dimensional space with a first direction X, a perpendicular (orthogonal) second direction Y (FIG. 1A), and a third direction Z (FIGS. 1 and 1B) that is perpendicular (orthogonal) to the respective first and second directions X and Y. Structures or features along any two of these directions are orthogonal to one another.

As best shown in FIG. 1, the electronic device 100 has opposite first and second (e.g., bottom and top) sides 101 and 102, respectively, which are spaced apart from one another along the third direction Z. The electronic device 100 has laterally opposite third and fourth sides 103 and 104 (FIGS. 1 and 1A) that are spaced apart from one another along the first direction X, and opposite fifth and sixth sides 105 and 106 (FIG. 1A) spaced apart from one another along the second direction Y in the illustrated orientation. The sides 101-106 in one example have substantially planar outer surfaces. In other examples (not shown), one or more of the sides 101-106 have curves, angled features, or other non-planar surface features. The electronic device 100 includes a die attach pad 107 (e.g., FIGS. 1 and 1B), such as an electrically conductive metal structure, a package structure 108, and conductive leads 109 partially exposed outside the package structure 108 to allow electrical connection to external structures or devices of a host system (e.g., by soldering, clamping in a socket, etc.).

The electronic device 100 also includes a semiconductor die 110 attached to and supported by the die attach pad 107 and the semiconductor die 110 is at least partially enclosed by the package structure 108. The semiconductor die 110 has opposite first and second sides 111 and 112, respectively (e.g., bottom and top sides), which are spaced apart from one another along the third direction Z. The semiconductor die 110 has lateral sidewalls 113-116 that extend between the respective first and second sides 111 and 112, with opposite lateral sidewalls 113 and 114 (FIGS. 1 and 1A) spaced apart from one another along the first direction X and opposite lateral sidewalls 115 and 116 (FIG. 1A) spaced apart from one another along the second direction Y.

The example semiconductor die 110 is a silicon on insulator (SOI) structure that includes a bottom base portion 117 (FIGS. 1 and 1B), which in one example is or includes a semiconductor material such as silicon, gallium arsenide, etc., as well as an insulator layer 118 (e.g., $SiO_2$, etc. shown in FIG. 1), and an upper semiconductor layer 119 (FIG. 1), such as silicon, gallium arsenide, etc. in a stacked arrangement. The semiconductor die 110 in one example includes one or more electronic components (e.g., transistors, diodes, resistors, etc.) formed on or in the upper semiconductor layer 119. The semiconductor die 110 can also include a single or multilevel metallization structure along the second or top side 112 with conductive metal interconnections to the component or components of the upper semiconductor layer 119, where one or more further components (e.g., inductors, transformers, resistors, capacitors, etc.) can be formed in whole or in part in the metallization structure. In other implementations, the insulator layer 118 can be omitted, for example, using a non-SOI structure with a semiconductor body having upper and lower portions 119 and 117 or one or more electronic components formed on and/or in a single semiconductor body with respective first and second sides 111 and 112.

The semiconductor die 110 has an indent 120 (FIGS. 1 and 1B) that extends laterally into respective lower portions of the lateral sidewalls 113, 114, 115, and 116 (e.g., into the lateral sides of the bottom base portion 117). The indent 120 extends downward to the first side 111 of the semiconductor die 110. The semiconductor die 110 also has an electrical isolation coating layer 122 that extends on the first side 111. The electrical isolation coating layer 122 in the example of FIGS. 1-1B extends along the indent 120 and on the first side 111. In other implementations, the semiconductor die does not include an indent and the electrical isolation coating layer extends at least partially on the first side 111. The electrical isolation coating layer 122 can be any suitable isolation material that provides a desired level of electrical isolation between a circuit or electrical component(s) formed on or in the semiconductor die 110 and other structures, such as the die attach pad 107 and any host circuitry to which the die attach pad 107 is coupled. In certain implementations, moreover, the electrical isolation coating layer 122 provides good thermal conduction, for example, the facilitate heat removal from the semiconductor die 110.

FIG. 1B shows further details of a lower side portion of one implementation of the electronic device 100, in which the indent 120 extends laterally into lower portion of the lateral sidewall 113 along the first direction X (e.g., into the lateral sides of the bottom base portion 117) by a first dimension 141 (e.g., approximately 45 to 100 μm) and the indent 120 extends downward to the first side 111 of the semiconductor die 110 by a second dimension 141 (e.g., approximately 75 to 150 μm). In certain examples, the thickness, location and material of the electrical isolation coating layer 122 are tailored to provide high insulation resistance and a desired level of dielectric breakdown voltage withstanding with little or no leakage current. The electrical isolation coating layer 122 in one example has a high thermal conductivity, such as approximately 1.2 W/(mK) or more.

In one example, the electrical isolation coating layer 122 is or includes silicon dioxide (e.g., $SiO_2$), for example, formed by chemical vapor deposition (CVD), atomic layer deposition (ALD), or other suitable process to a suitable thickness of approximately 0.1 μm or more and approximately 10 μm or less, such as approximately 2 μm or more and approximately 5 μm or less, with a coefficient of thermal expansion (CTE) of approximately 0.6 parts per million per degree C. (ppm/degree C.).

In another example, the electrical isolation coating layer 122 is or includes parylene (e.g., $C_{16}H_{14}Cl_2$), for example, parylene (dixC) formed by vapor deposition polymerization (VDP) or other suitable process to a suitable thickness of approximately 0.1 μm or more and approximately 10 μm or less, such as approximately 2 μm or more and approximately 5 μm or less, with breakdown voltage of approximately 272 volts per micron (V/μm), and a CTE of approximately 30.1 ppm/degree C.

In another example, the electrical isolation coating layer 122 is or includes polyimide (e.g., $C_{19}H_6F_6O_6$), for example, formed by suitable process to a suitable thickness of approximately 0.1 μm or more and approximately 10 μm or less, such as approximately 2 μm or more and approximately 5 μm or less, with breakdown voltage of approximately 250 V/μm, and a CTE of approximately 40-70 ppm/degree C.

In another example, the electrical isolation coating layer 122 is or includes polyamide (e.g., polyamideimide or PAI), for example, a selective spray coating or other suitable deposition process to a suitable thickness of approximately 0.1 μm or more and approximately 10 μm or less, such as approximately 2 μm or more and approximately 5 μm or less, with breakdown voltage of approximately 250 V/μm.

The semiconductor die 110 has one or more conductive terminals 124 (FIGS. 1 and 1A) exposed along the top or second side 112, such as copper or aluminum contacts or bond pads that provide electrical connection to the circuit or electrical component(s) formed on or in the upper semiconductor layer 119 of the semiconductor die 110. An adhesive 130 adheres the first side 111 of the semiconductor die 110 to the top side of the die attach pad 107 as shown in FIGS. 1 and 1B. The illustrated die attach pad 107 has a top side half etch trench to help control the lateral flow of the adhesive 130 during packaging. In other examples, different half etch trench configurations can be used and/or the half etch trench can be omitted. One or more of the conductive terminals 124 of the semiconductor die 110 are electrically coupled to respective ones of the conductive leads 109, for example, using conductive bond wires 132 (FIGS. 1 and 1A). The package structure 108 in one example is or includes an epoxy molding compound that encloses the semiconductor die 110 and the bond wires 132 and encloses interior portions of the die attach pad 107 and the leads 109.

The electronic device 100 is shown installed in a system in FIG. 1, such as a smart phone, laptop or desktop computer, a tablet, an automotive system, an industrial system, etc. In the illustrated example, the system includes a printed circuit board (PCB) 150 with other system circuits and components (not shown). The electronic device 100 is attached to the circuit board 150 with one or more of the conductive leads 109 electrically coupled to respective ones of the conductive terminals 124 of the semiconductor die 110 and to a respective conductive feature 152 of the circuit board 150.

Figure 2:
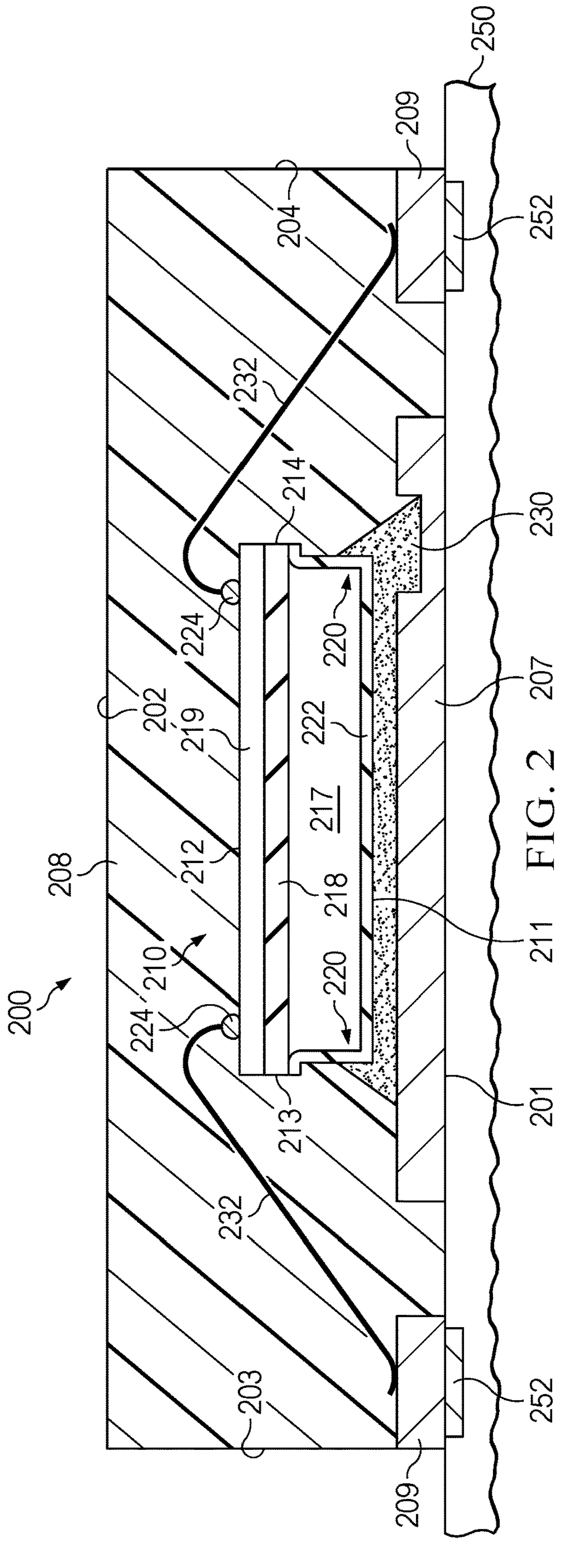
FIG. 2 is a sectional side elevation view of another electronic device with an electrical isolation coating layer conformally formed on a back or bottom side and in an indented portion of a lateral sidewall of a semiconductor die taken along line 2-2 of FIG. 2A.
Figure 2A:
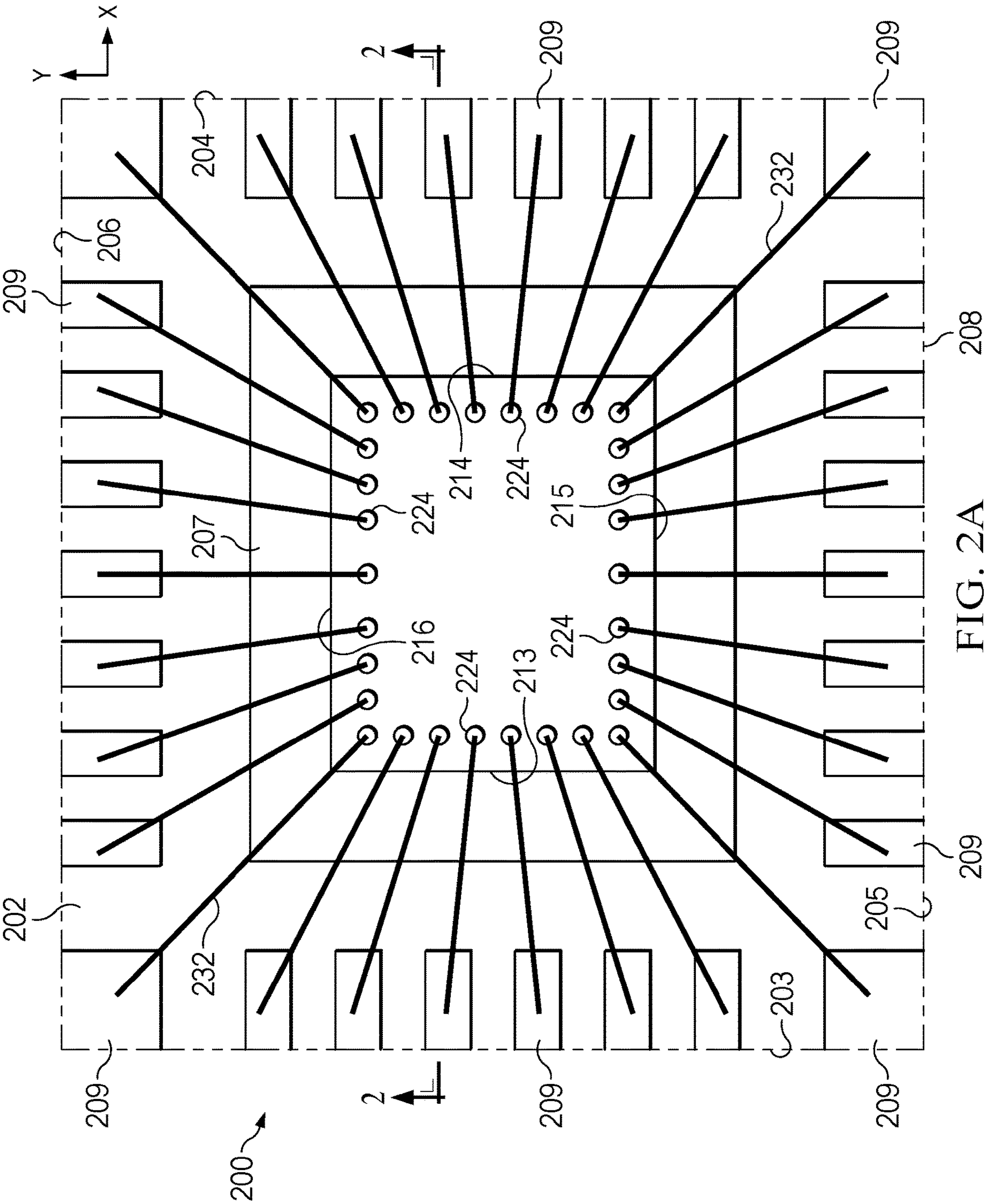
FIG. 2A is a top plan view of the electronic device of FIG. 2.

FIGS. 2 and 2A show respective sectional side and top views of another electronic device 200 with an electrical isolation coating layer conformally formed on a back or bottom side and in an indented portion of a lateral sidewall of a semiconductor die, where FIG. 2 shows a section view taken along line 2-2 of FIG. 2A. The electronic device 200 has an indent 220 that extends from the bottom side 211 of a semiconductor die 210 to the isolation layer 218 thereof with an electrical isolation coating layer 222 conformally formed on the bottom side 211 and in the indent 220 portion of the lateral sidewalls of the semiconductor die 210 as shown in FIG. 2. The semiconductor die 210 in FIGS. 2 and 2A includes a semiconductor base portion 217 that extends to the first side 211, an upper semiconductor layer 219 that extends to the second side 212, and an insulator layer 218 between the semiconductor base portion 217 and the upper semiconductor layer 219. In this example, the indent 220 extends into a portion of the insulator layer 218 and the electrical isolation coating layer 222 extends on a portion of the insulator layer 218. Apart from these and other differences apparent from the drawings, various other structures, dimensions, and/or features 201-222, 224, 230, and 232 correspond to the respective structures, dimensions, and/or features 101-122, 124, 130, and 132 described above in connection with the electronic device 100 of FIGS. 1-1B. The further upward extension of the lateral sidewall coverage of the electrical isolation coating layer 222 can enhance the electrical isolation and breakdown voltage rating between the die attach pad 207 and circuitry of the semiconductor die 210.

Figure 3:
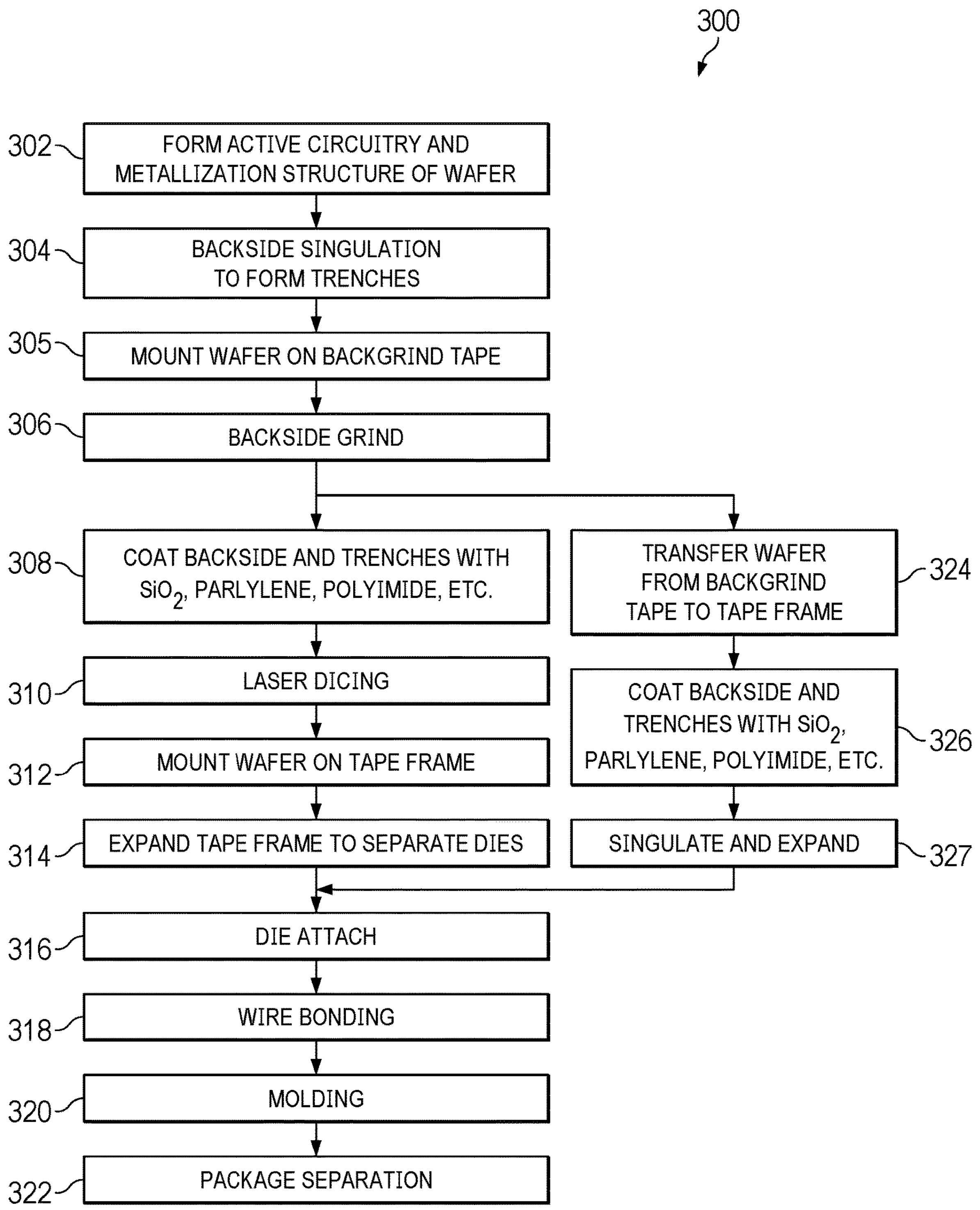
FIG. 3 is a flow diagram of a method of fabricating an electronic device with a conformal electrical isolation coating layer.

Referring now to FIGS. 3-17A, FIG. 3 illustrates a method 300 of fabricating an electronic device with a conformal electrical isolation coating layer, FIGS. 4-14 show the electronic device 100 undergoing fabrication processing according to an example implementation of the method 300 and FIGS. 15-17A show the electronic device 100 undergoing fabrication processing according to another example implementation of the method 300 of FIG. 3. In other implementations, the example method 300 can be used to form the electronic device 200 illustrated and described above in connection with FIGS. 2 and 2A.

Figure 4:
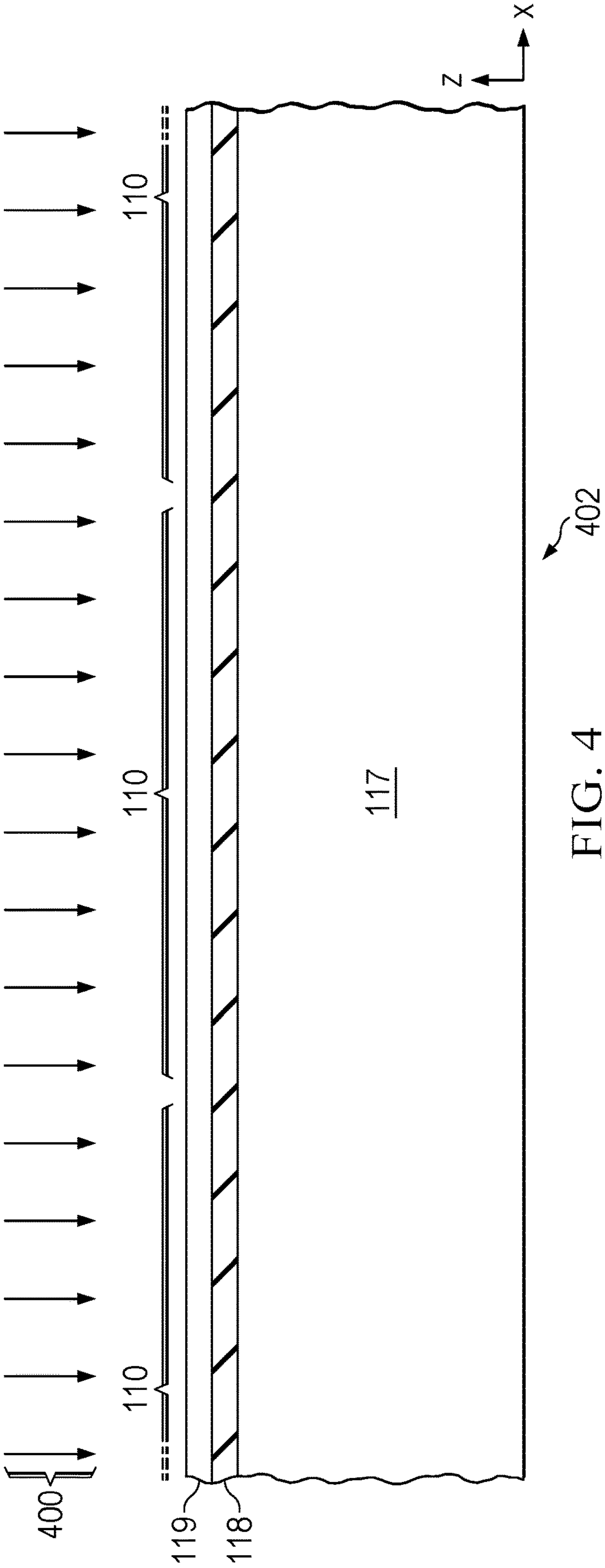
FIGS. 4-14 are sectional side elevation and top perspective views of an electronic device undergoing fabrication processing according to an example implementation of the method of FIG. 3.

In one example, the method 300 includes forming active circuitry and a metallization structure in individual unit areas of a starting wafer at 302. The semiconductor wafer can be a silicon wafer, a silicon-on-insulator (SOI) substrate or other semiconductor structure (e.g., gallium arsenide, etc.). FIG. 4 shows one example of a starting SOI wafer 402 undergoing fabrication processing 400 that forms one or more electronic components in each individual unit area of the wafer 402. In this example, the wafer 402 has a cylindrical shape with rows and columns of unit areas 110 indicated in the drawings to correspond to ultimately separated semiconductor dies 110 as described above in connection with FIGS. 1-1B. The example wafer 402 includes the bottom base portion 117 that is or includes a semiconductor material such as silicon, gallium arsenide, etc., with a starting thickness that may be subsequently reduced to provide a desired final semiconductor die thickness. The wafer 402 in this example also includes the insulator layer 118 (e.g., $SiO_2$) formed over the base portion 117, as well as the upper semiconductor layer 119 (e.g., silicon, gallium arsenide, etc.) on the insulator layer 118. In one example, the upper semiconductor layer 119 is or includes epitaxial silicon on and/or in which one or more electronic components (e.g., transistors, diodes, resistors, etc.) are formed at 302 in FIG. 3. The processing at 302 in this example also forms a single or multilevel metallization structure along the second or top side 112 with conductive metal interconnections to the component or components of the upper semiconductor layer 119, and one or more further components (e.g., inductors, transformers, resistors, capacitors, etc.) can be formed in whole or in part in the metallization structure. In another implementations, the insulator layer 118 is omitted, for example, using a non-SOI starting wafer with a semiconductor body having upper and lower portions 119 and 117 or one or more electronic components formed on and/or in a single semiconductor body and a metallization structure formed on the top side of the upper portion 119.

Figure 5:
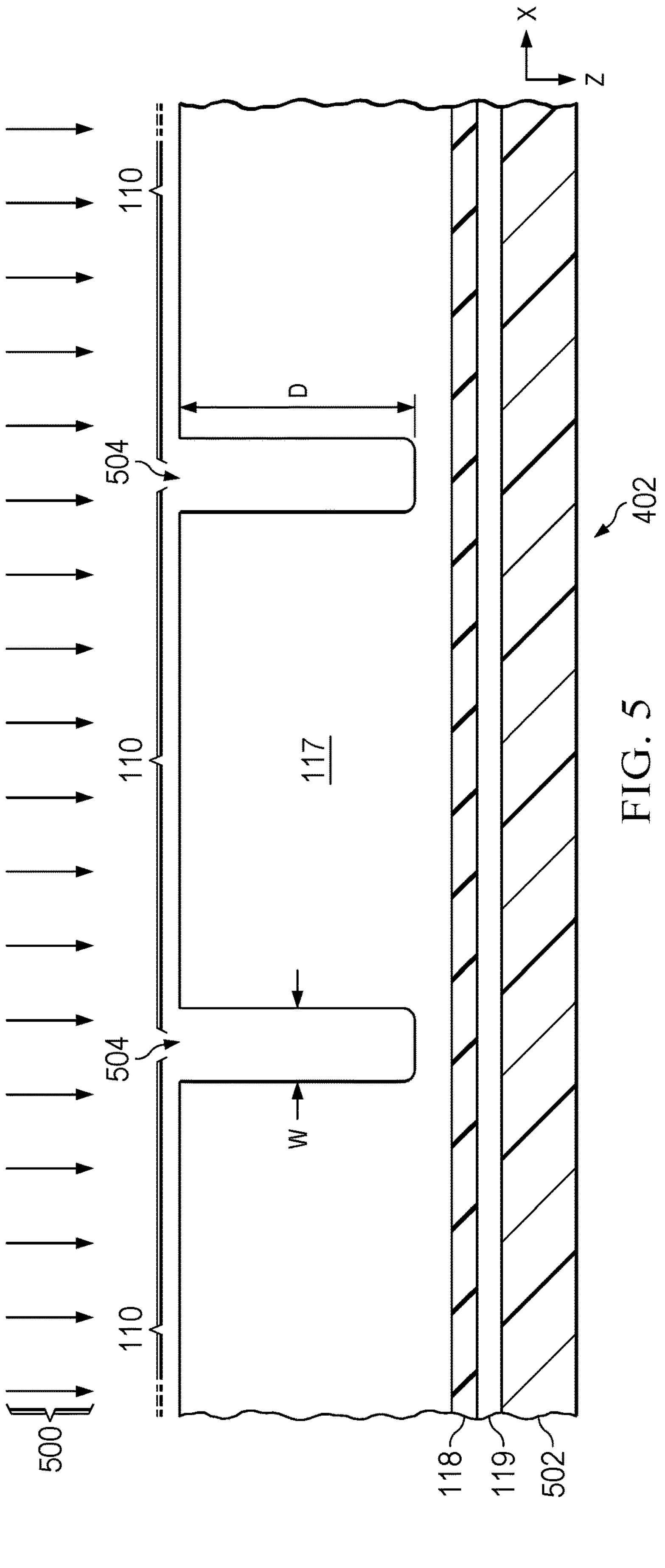

The method 300 continues at 304 in FIG. 3 with backside singulation to form trenches that extend into the back or first side of the wafer 402. FIG. 5 shows one example, in which a trench formation process 500 is performed with the top side of the wafer 402 mounted to a carrier structure 502, such as a tray or carrier tape. The process 500 forms trenches 504 with a lateral width W that extend to a depth D into the back side of the wafer 402. In one example, the trench formation process 500 is or includes mechanical sawing. In another implementation, an etch process can be used to form the trenches 504, such as a plasma etch.

Figure 6:
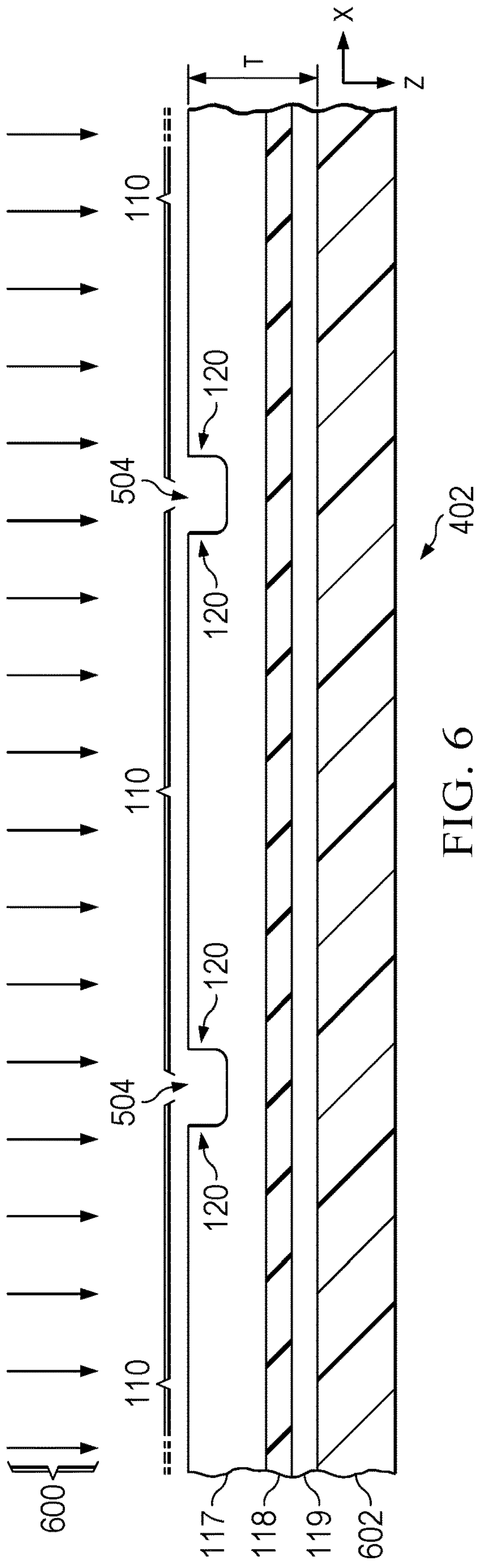

At 305 in FIG. 3, the method 300 includes mounting the wafer on the back grind tape carrier structure, followed by backside grinding at 306. FIG. 6 shows one example, in which a back grinding process 600 is performed that grinds a portion of the back or bottom side of the wafer 402 while the top or front side of the wafer 402 is mounted on a back grind tape carrier 602. The back grinding process 600 reduces the depths of the trenches 504 and sets a semiconductor die thickness T shown in FIG. 6. The ultimately completed semiconductor die 110 in this example will have a thickness along the third direction Z of the ground die thickness T plus the thickness of the subsequently formed electrical isolation coating layer 122 as shown above in FIG. 1. FIG. 6 further indicates the side portions of the trenches 504 that form the prospective indents 120 of the subsequently separated individual semiconductor dies 110.

Figure 7:
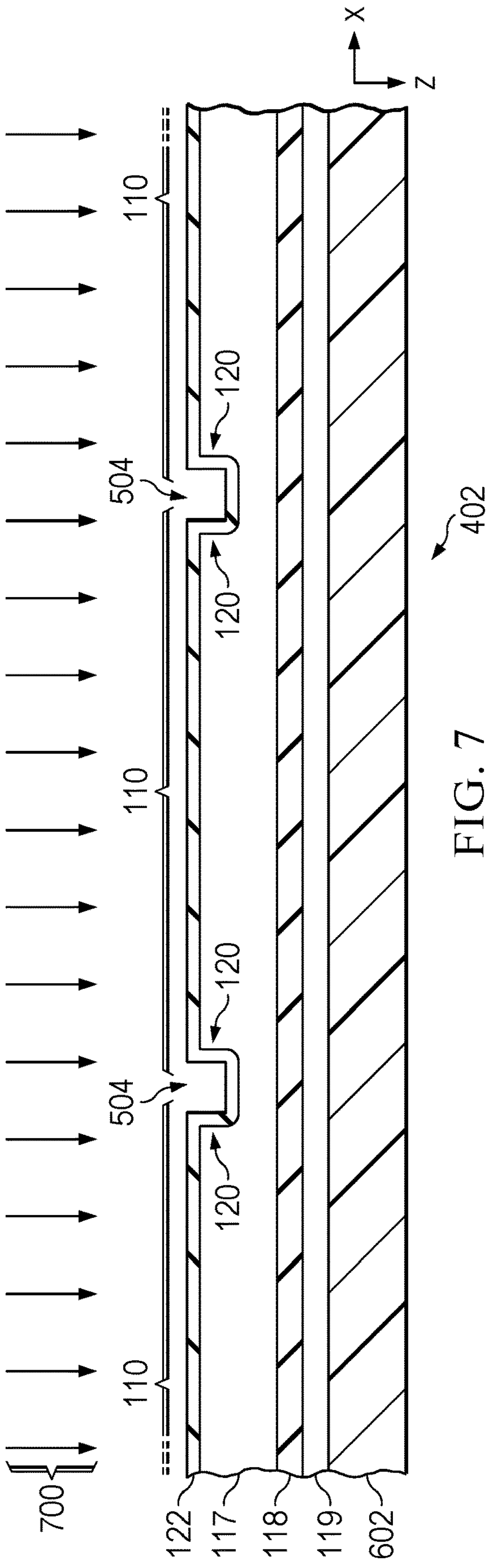

The example method 300 in FIG. 3 includes two alternate implementations for certain processing steps performed to form an electrical isolation coating layer on the first side and in the trenches 504 after the backside grinding at 306. The first implementation includes coating the back side of the wafer 402 and the bottoms and sidewalls of the trenches 504 at 308 to form the electrical isolation coating layer 122. FIG. 7 shows one example, in which a deposition process 700 is performed that forms the electrical isolation coating layer 122 on the back side of the wafer 402 and on the bottoms and sidewalls of the trenches 504. In one example, the deposition process 700 forms the electrical isolation coating layer 122 to a thickness of approximately 0.1 μm or more and approximately 10 μm or less, such as approximately 2 μm or more and approximately 5 μm or less.

Any suitable deposition process 700 can be used to provide the electrical isolation coating layer 122 of a suitable material and thickness having high insulation resistance and a desired level of dielectric breakdown voltage withstanding with little or no leakage current. In certain implementations, the deposition process 700 provides the electrical isolation coating layer 122 having a high thermal conductivity, such as approximately 1.2 W/(mK) or more. In one example, the deposition process 700 is or includes a chemical vapor deposition process that forms the electrical isolation coating layer 122 of or including silicon dioxide (e.g., $SiO_2$). In another example, the deposition process 700 is or includes a vapor deposition polymerization process that forms the electrical isolation coating layer 122 of for including parylene (e.g., $C_{16}H_{14}Cl_2$). In another example, the deposition process 700 forms the electrical isolation coating layer 122 that is or includes polyimide (e.g., $C_{19}H_6F_6O_6$). In another example, the deposition process 700 is or includes a selective spray coating process that forms the electrical isolation coating layer 122 of or including polyamide (e.g., polyamideimide or PAI).

Figure 8:
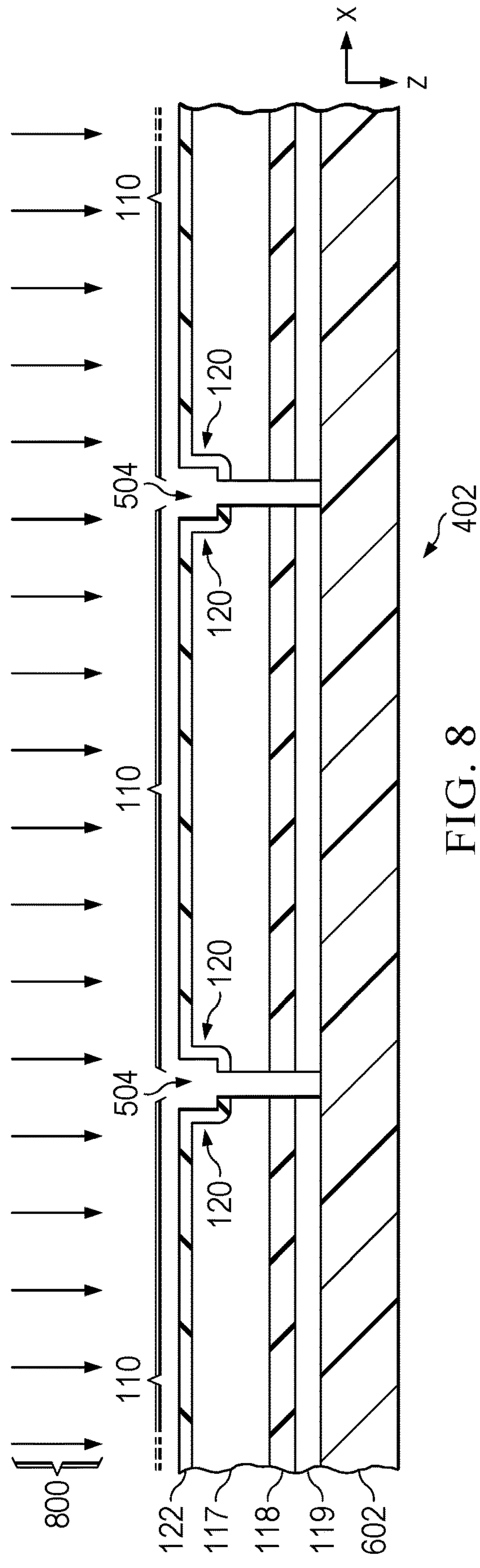

The method 300 also include separating individual semiconductor dies 110 from the processed wafer 402. The first implementation in FIG. 3 includes laser dicing at 310. FIG. 8 shows one example, in which a laser dicing or cutting process 800 is performed along the back side of the wafer 402 while the top or front side of the wafer 402 remains installed on the back grind tape carrier 602. The process 800 in one example at least partially separates individual unit areas from one another, for example, by creating cracks that extend the previously formed trenches 504 downward and/or which create cracks beneath the bottoms of the trenches 504 using a laser etching or cutting tool (not shown).

Figure 9:
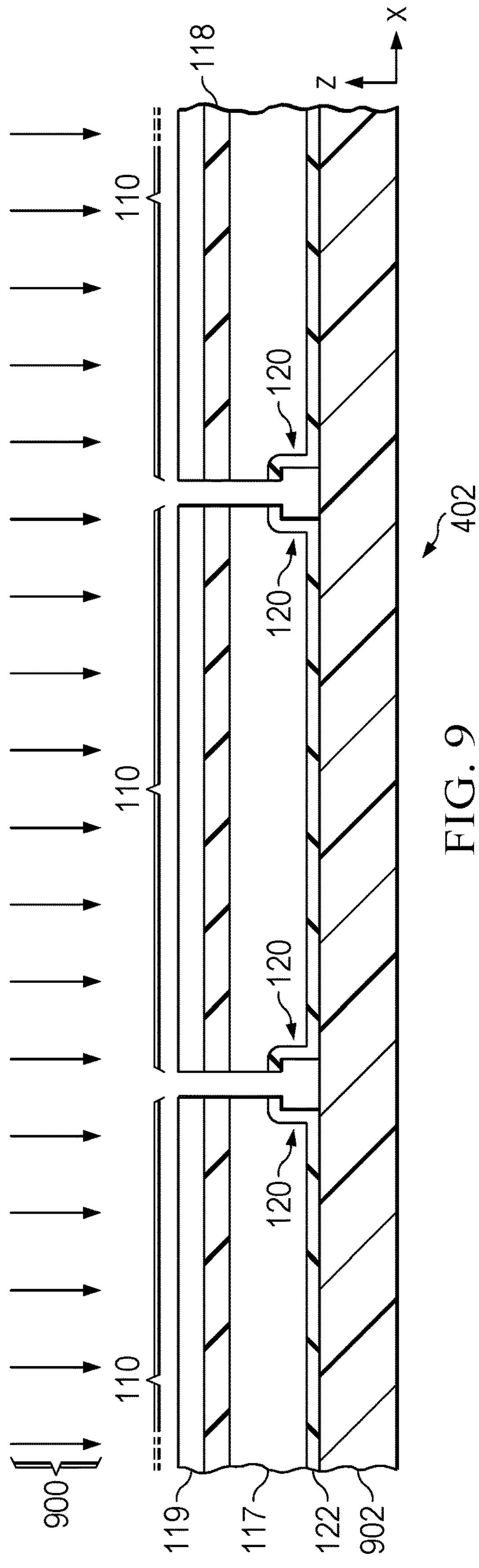

The example separation continues at 312 in FIG. 3 with mounting the wafer 402 on a tape frame. FIG. 9 shows one example, in which the wafer 402 is removed from the back grind tape carrier and an installation process 900 is performed that mounts the back or first side of the wafer with the electrical isolation coating layer 122 engaging a carrier tape or tape frame 902.

Figure 10:
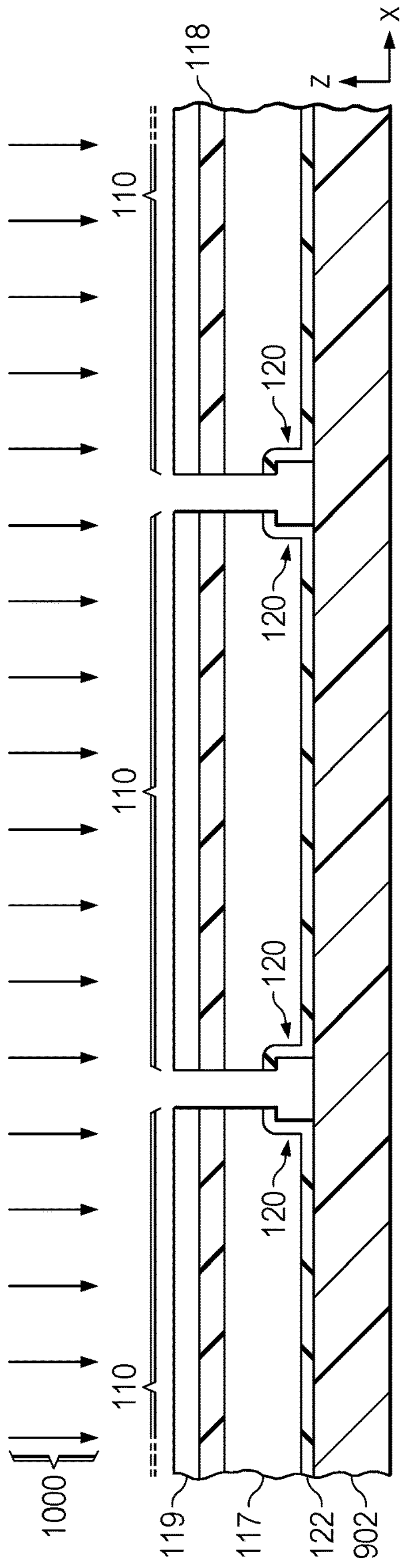
Figure 10A:
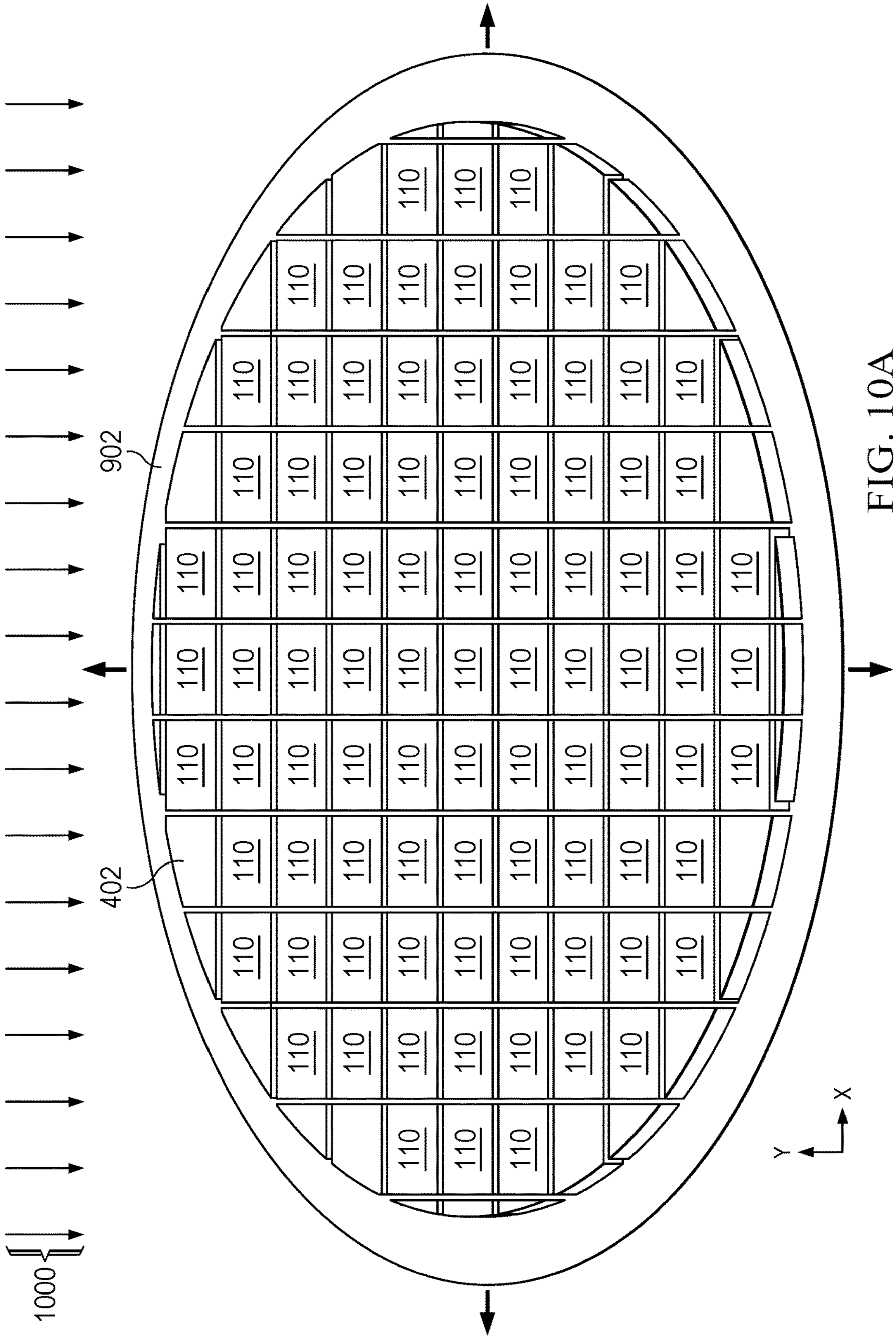

The method 300 continues at 314 in FIG. 3 with expanding the tape frame to separate the individual dies from the starting wafer structure. FIGS. 10 and 10A a show one example, in which an expansion or stretching process 1000 is performed that separates individual instances of the semiconductor die 110 from the wafer 402. In one example, a wafer expander tool (not shown) is configured to support the wafer 402 on the tape frame 902 and stretch the tape frame 902 radially outward in a plane of the first and second directions X and Y as best shown in FIG. 10A to mechanically separate individual dies 110 from the wafer 402. The separation of the individual semiconductor dies 110 leaves the indents 120 along the bottom portions of the lateral sidewalls (e.g., FIGS. 1-1B above) coated with the electrical isolation coating layer 122. The individual separated semiconductor dies 110 have a portion of the initially formed first side of the wafer as well as an opposite second side with the previously formed conductive terminals on the second side, and the associated portion of the electrical isolation coating layer 122 that extends along the indent 120 and on the portion of the first side 111.

Figure 11:
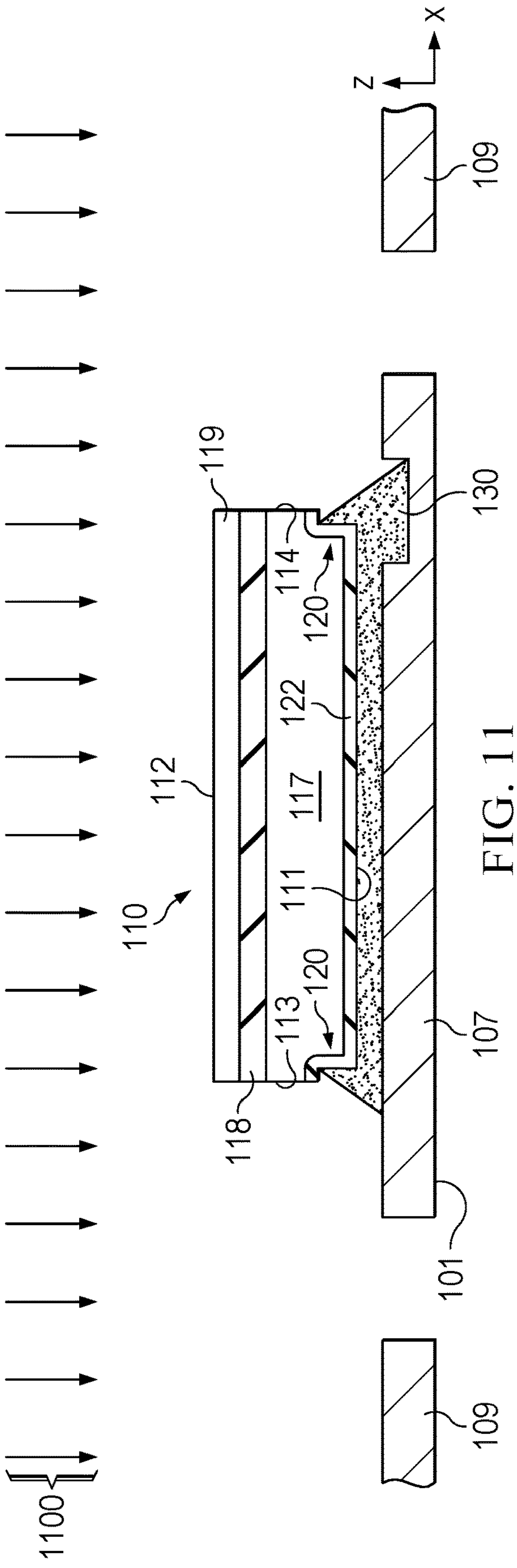

The method 300 continues with packaging of individual electronic devices at 316-322 in FIG. 3. The illustrated example includes packaging using a lead frame panel array with rows and columns of individual unit areas, each having a die attach pad 107 and corresponding leads 109, where the example die attach pads 107 have the above-described trench half etch feature. At 316 in FIG. 3, the method 300 includes die attach processing. FIG. 11 shows one example, in which a die attach process 1100 is performed that includes dispensing the adhesive 130 onto portions of the top sides and trenches of respective die attach pads 107 in each individual unit area of the lead frame panel array. In one example, automated pick and place equipment (not shown) is used to attach the bottom or first side 111 of the semiconductor die 110 to the adhesive 130 along the side of the die attach pad 107. One implementation includes attaching the semiconductor die 110 to the die attach pad 107 with the adhesive 130 extending into a half-etch indent in the die attach pad 107 (e.g., FIG. 1 above) to control adhesive flow and fillet height of the adhesive 130 along the indents 120 of the semiconductor die 110.

Figure 12:
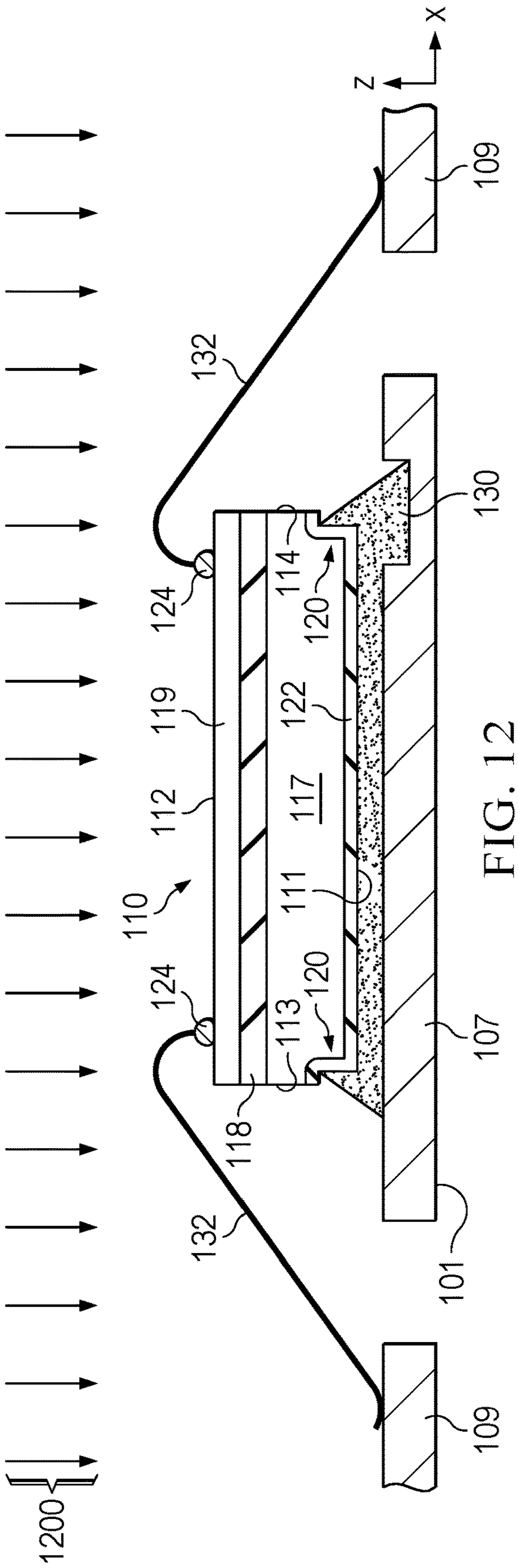

At 318 in FIG. 3, the method 300 continues with electrical connection processing. FIG. 12 shows one example, in which a wire bonding process 1200 is performed that forms the bond wires 132 between the semiconductor die conductive terminals 124 and respective ones of the conductive leads 109 in each unit area of the lead frame panel array.

Other electrical interconnections can be formed at 318, for example, connections to other components or further dies (not shown) in each unit area.

Figure 13:
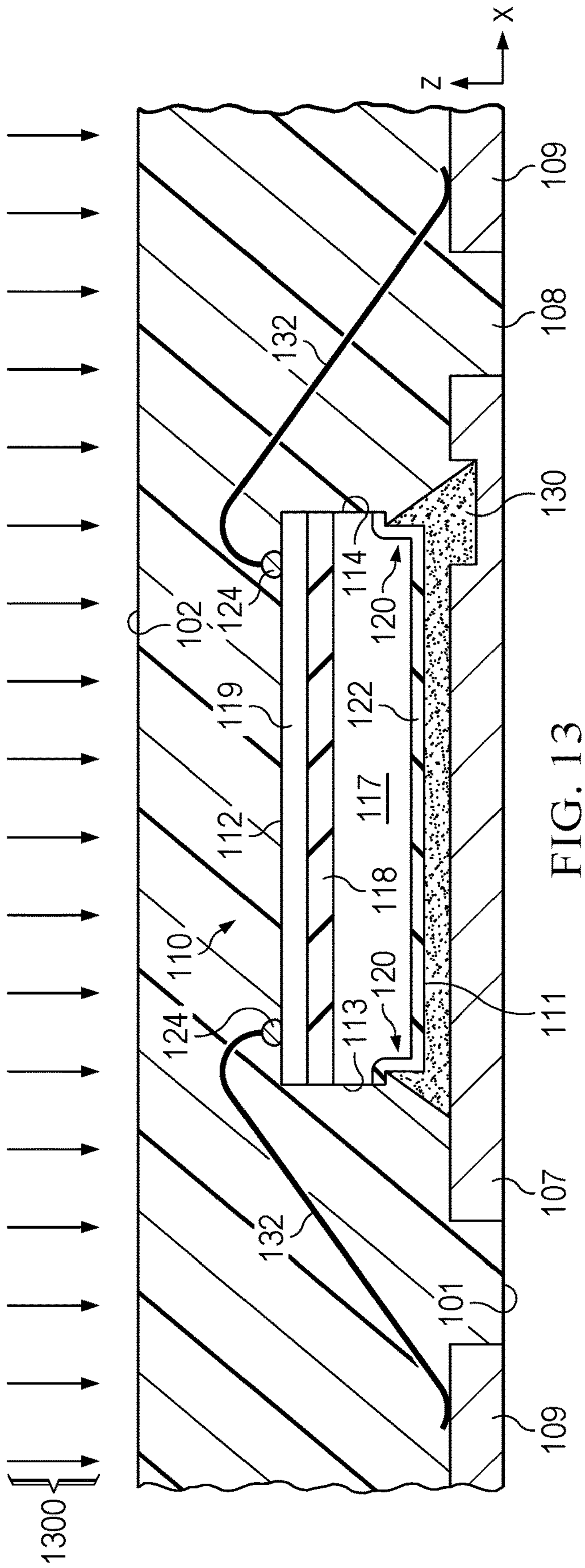

A package structure is formed at 320 in FIG. 3. FIG. 13 shows one example, in which a molding process 1300 is performed that forms the package structure 108. In one implementation, the molding at 320 can be performed using any suitable molding equipment. In one implementation, a single mold cavity can be used for an entire panel array or multiple cavities can be used for individual unit areas thereof or groups of unit areas, such as column-wise mold cavities, or combinations thereof. The package structure 108 in one example is or includes an epoxy molding compound (EMC) that at least partially encloses the semiconductor die 110 and upper portions of the die attach pad 107 and the leads 109 in each unit area of the panel array. In certain examples, the molding process 1300 can include separate formation of multiple molded portions of a package structure, such as initial mold underfill formation, followed by a subsequent top molding process, or the molding at 320 can create a mold underfill followed by attachment of a metal lid (not shown) over at least a portion of a top side of the semiconductor die 110 without forming a second top mold structure.

Figure 14:
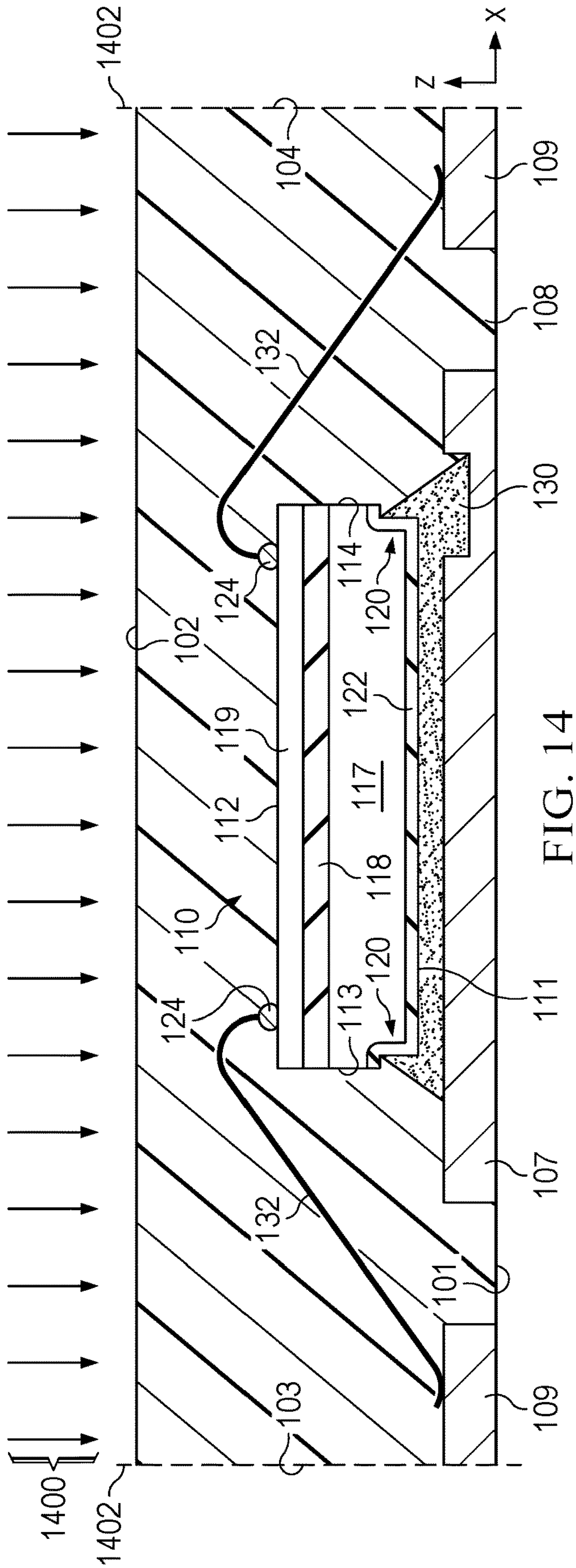

The method 300 in one example also includes package separation at 322 in FIG. 3 to separate individual packaged electronic devices 100 from the processed panel array structure. FIG. 14 shows one example, in which a saw cutting separation process 1400 is performed that separates individual packaged electronic devices 100 from the processed panel array structure by cutting along lines 1402. Any suitable cutting or separation process can be used, including without limitation saw cutting, laser cutting, chemical etching, etc. or combinations thereof. In certain examples, the method 300 can also include final device testing after package separation at 322 and/or wafer level testing (e.g., before backside singulation at 304 and FIG. 3).

Figure 15:
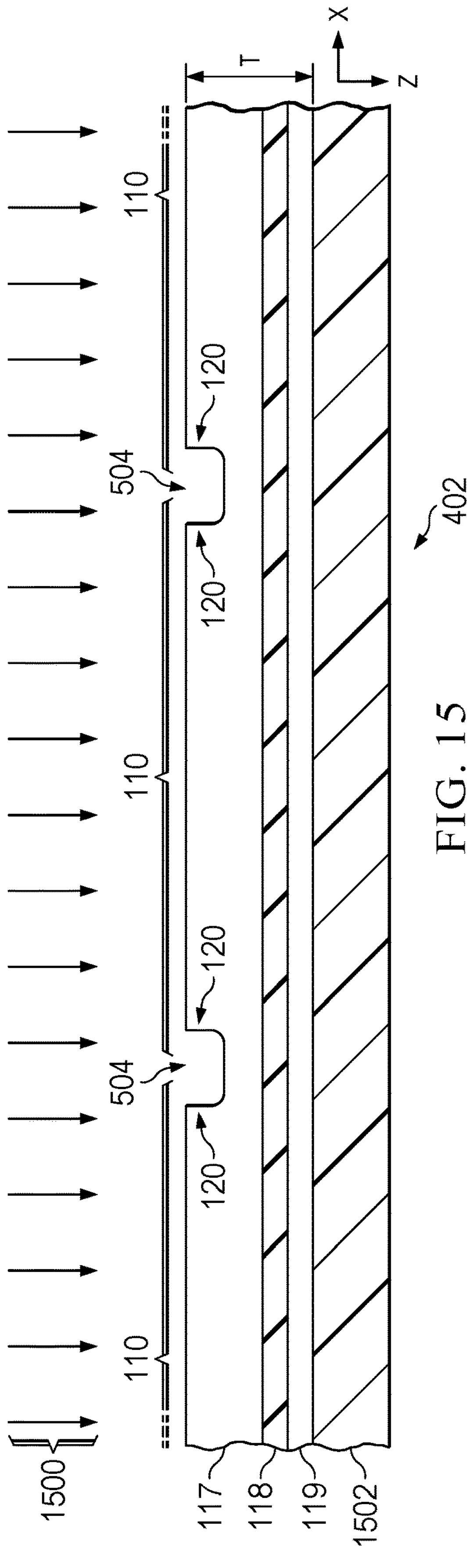
FIGS. 15-17A are sectional side elevation and top perspective views of an electronic device undergoing fabrication processing according to another example implementation of the method of FIG. 3.

The method 300 in FIG. 3 also includes another example implementation, continuing from the backside grinding at 306. The second implementation in FIG. 3 includes transferring the wafer 402 from the back grind tape to a tape frame at 324. FIG. 15 shows one example, in which a transfer process 1500 removes the processed wafer 402 from the back grind tape carrier 602 (e.g., FIG. 6 above), and installs the wafer 402 with the top or second side on a tape frame 1502.

Figure 16:
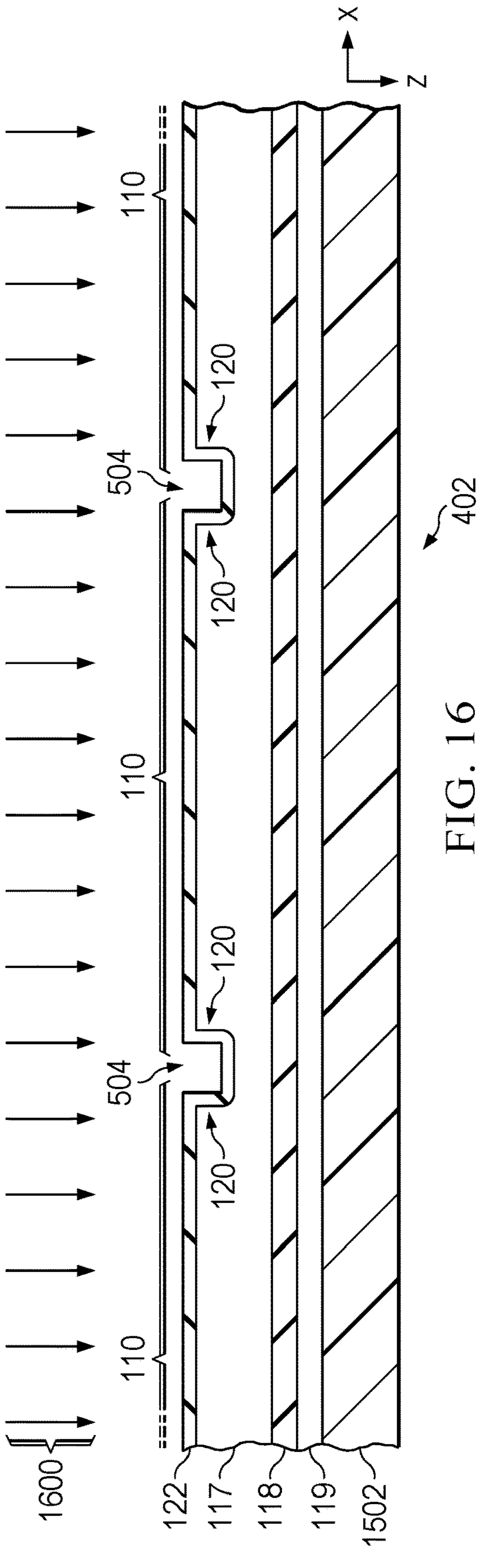
Figure 17:
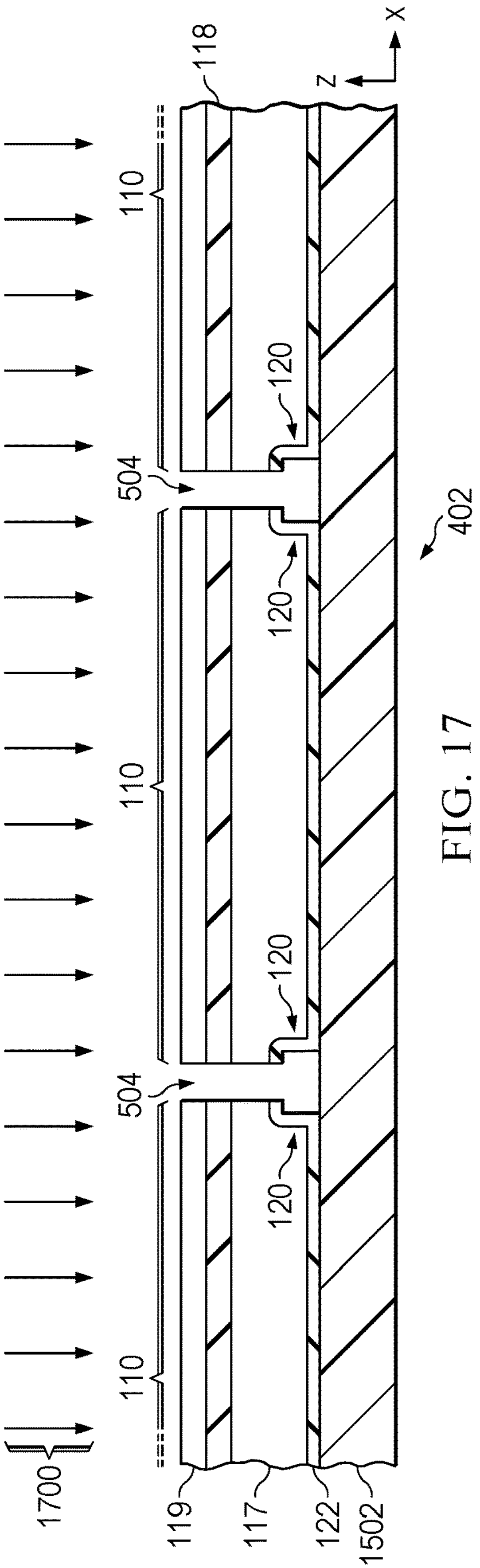
Figure 17A:
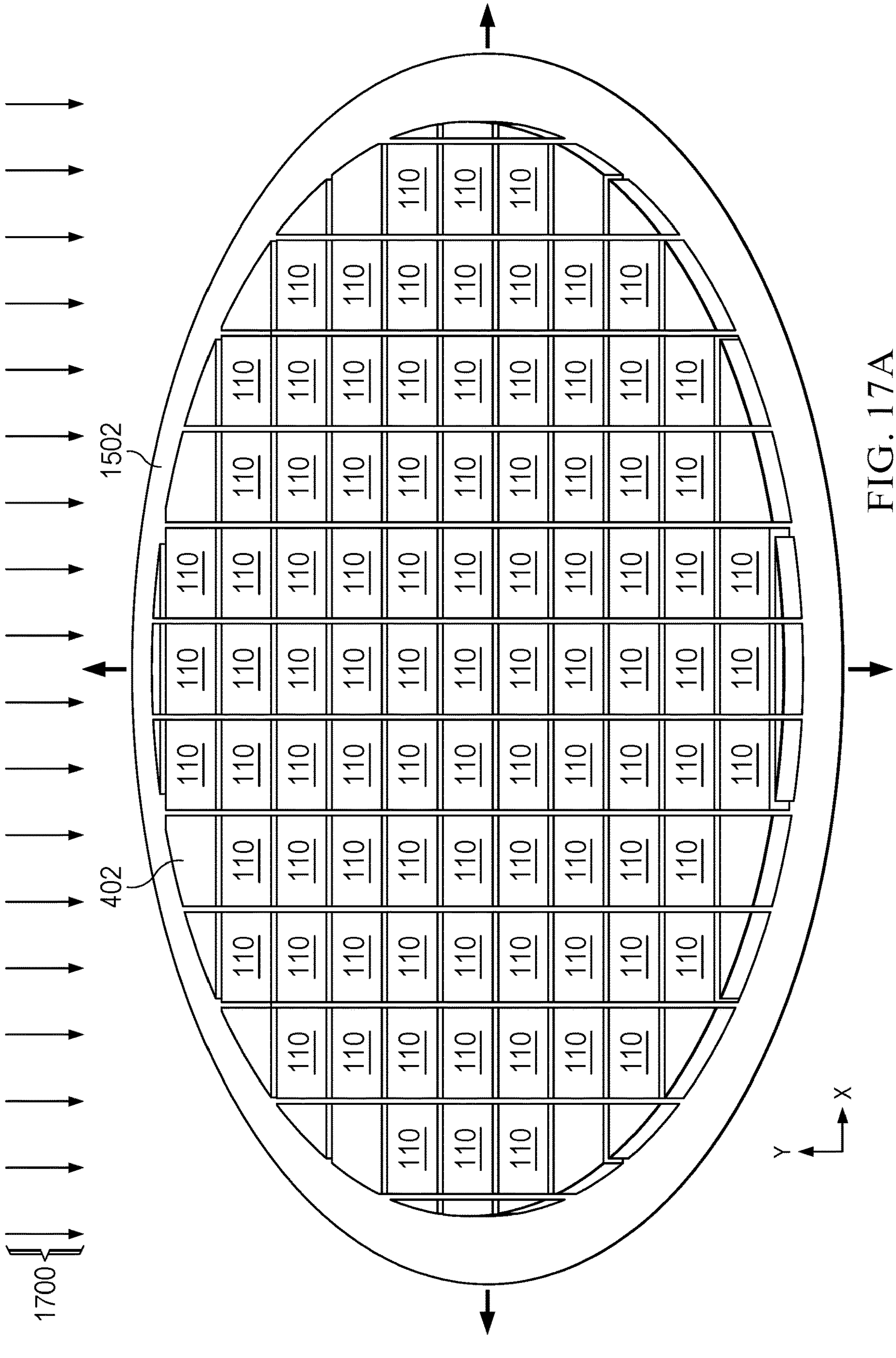

The second implementation in FIG. 3 includes coating the back side of the wafer 402 and the bottoms and sidewalls of the trenches 504 at 326 to form the electrical isolation coating layer 122. FIG. 16 shows one example, in which a deposition process 1600 is performed that forms the electrical isolation coating layer 122 on the back side of the wafer 402 and on the bottoms and sidewalls of the trenches 504. In one example, the deposition process 1600 forms the electrical isolation coating layer 122 to a thickness of approximately 0.1 μm or more and approximately 10 μm or less, such as approximately 2 μm or more and approximately 5 μm or less. Any suitable deposition process 1600 can be used to provide the electrical isolation coating layer 122 of a suitable material (e.g., $SiO_2$, parylene, polyimide, etc.) using a suitable deposition technique (e.g., CVD, VDP, selective spray coating, etc.) as described in connection with FIG. 7 above (e.g., at 308 in FIG. 3). The second implementation of the method 300 continues after the coating at 326 with wafer die separation or singulation and expansion at 327. FIGS. 17 and 17A show one example, in which an expansion or stretching process 1700 is performed that separates individual instances of the semiconductor die 110 from the wafer 402. In one example, a wafer expander tool (not shown) is configured to support the wafer 402 on the tape frame 1502 and stretch the tape frame 1502 radially outward in a plane of the first and second directions X and Y as best shown in FIG. 17A to mechanically separate individual dies 110 from the wafer 402. The second implementation of the method 300 continues with packaging at 316-322, for example, as described above in connection with FIGS. 11-14 to finish fabrication of a packaged electronic device 100 with a conformal electrical isolation coating layer 122.

Referring now to FIGS. 18-31, FIG. 18 shows another example method 1800 of fabricating an electronic device with a conformal electrical isolation coating layer and FIGS. 19-31 show the example electronic device 100 undergoing fabrication processing according to three example implementations of the method 1800. In other implementations, the example method 1800 can be used to form the electronic device 200 illustrated and described above in connection with FIGS. 2 and 2A. FIGS. 19-25A show the example electronic device 100 undergoing fabrication processing according to a first example implementation of the method 1800.

Figure 19:
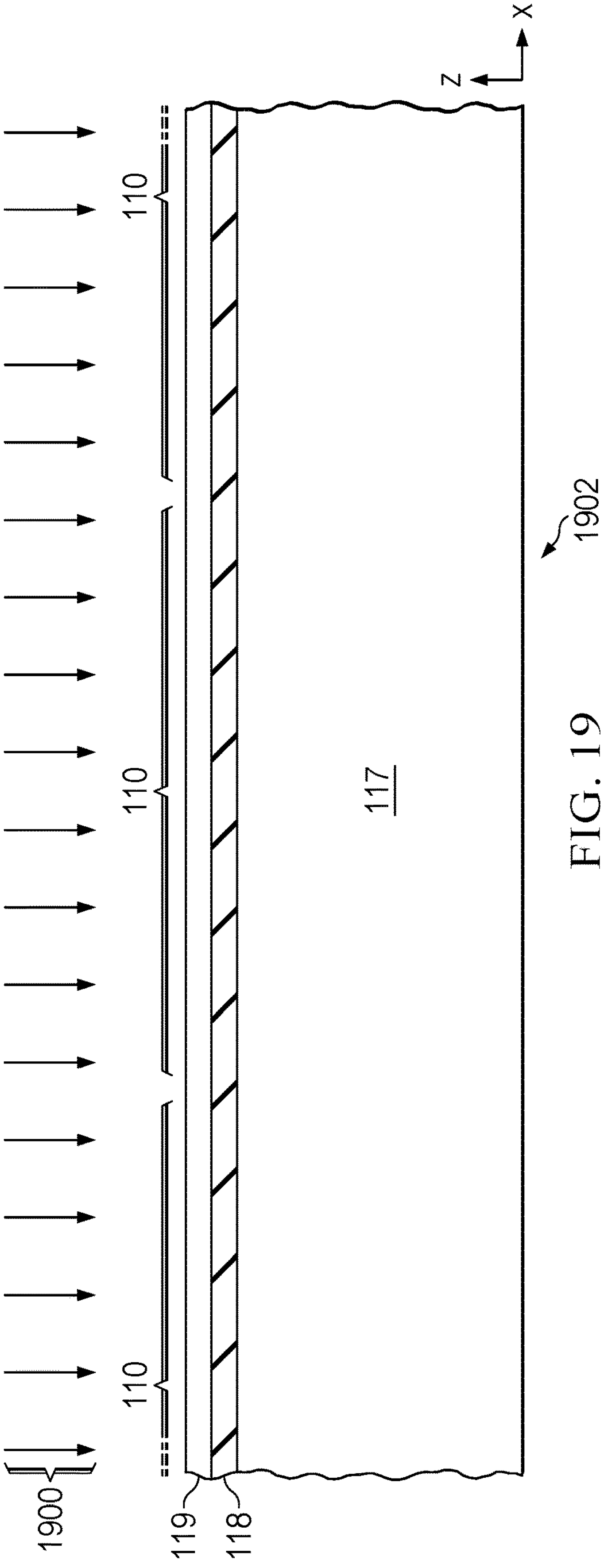
FIGS. 19-25A are sectional side elevation and top perspective views of an electronic device undergoing fabrication processing according to an example implementation of the method of FIG. 18.

The method 1800 includes forming active circuitry and a metallization structure in individual unit areas of a starting wafer at 1802. The semiconductor wafer can be a silicon wafer, a silicon-on-insulator (SOI) substrate or other semiconductor structure (e.g., gallium arsenide, etc.). FIG. 19 shows one example of a starting SOI wafer 1902 undergoing fabrication processing 1900 that forms one or more electronic components in each individual unit area of the wafer 1902 and forms a metallization structure, for example, using the materials and processing described above in connection with FIG. 4 (e.g., at 302 in FIG. 3 above).

Figure 18:
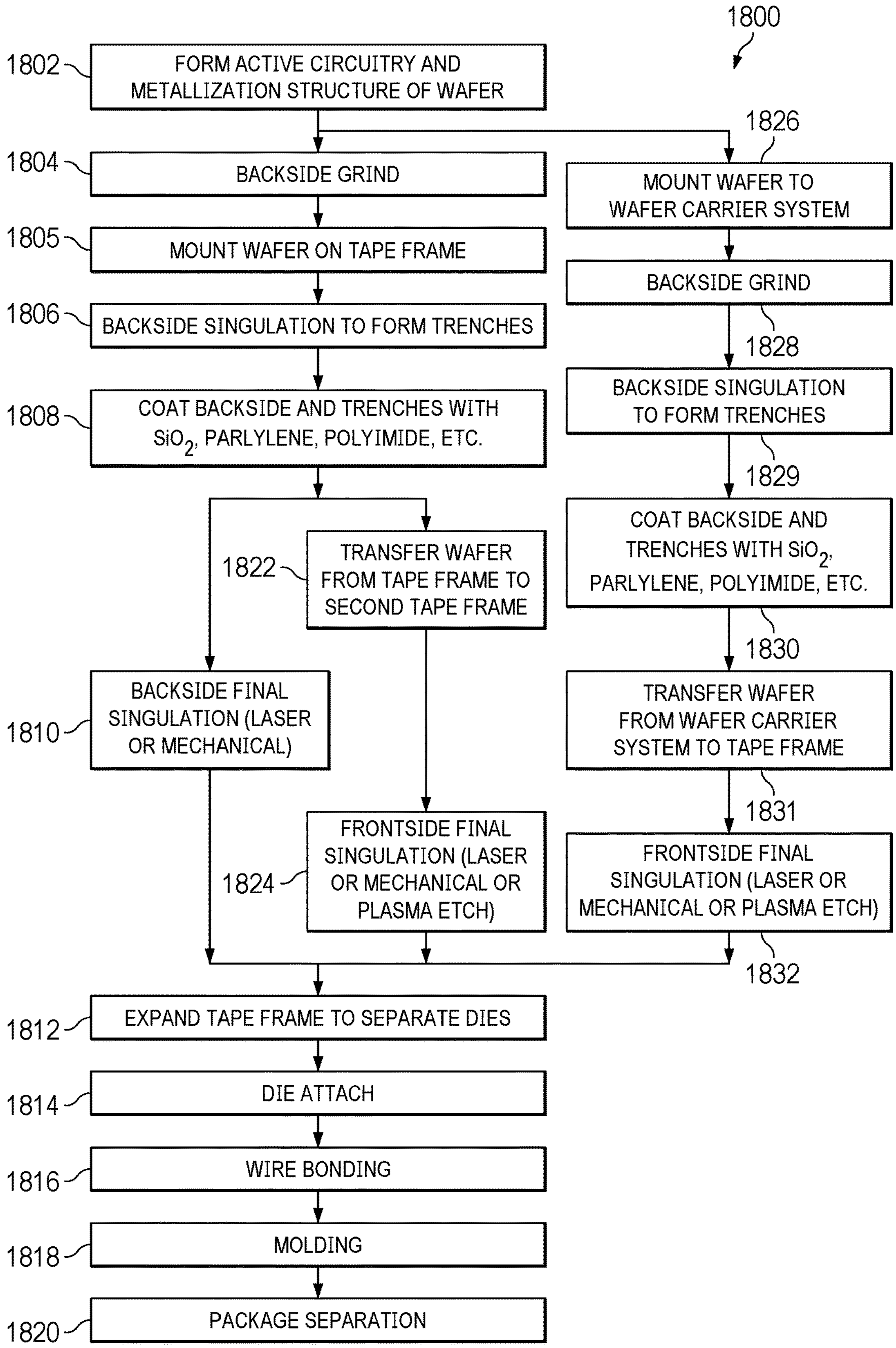
FIG. 18 is a flow diagram of another method of fabricating an electronic device with a conformal electrical isolation coating layer.
Figure 20:
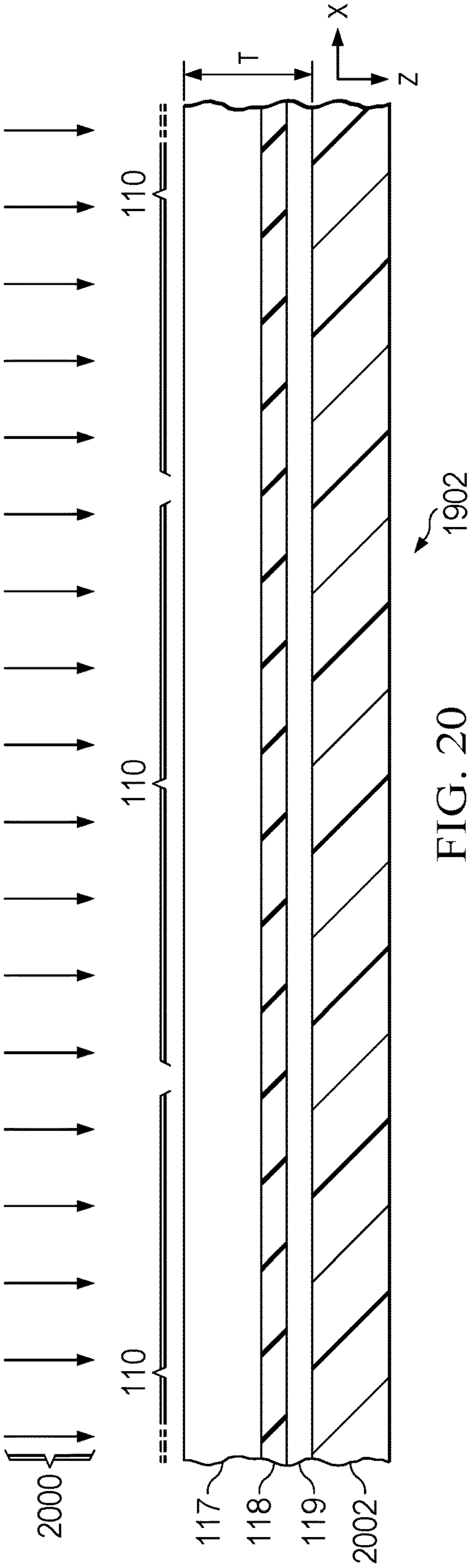

At 1804 in FIG. 18, the method 1800 includes backside grinding. FIG. 20 shows one example, in which a back grinding process 2000 is performed that grinds a portion of the back or bottom side of the wafer 1902 while the top or front side of the wafer 1902 is mounted on a back grind tape carrier 2002. The back grinding process 2000 sets a semiconductor die thickness T shown in FIG. 20. The ultimately completed semiconductor die 110 in this example will have a thickness along the third direction Z of the ground die thickness T plus the thickness of the subsequently formed electrical isolation coating layer 122 as shown above in FIG. 1.

Figure 21:
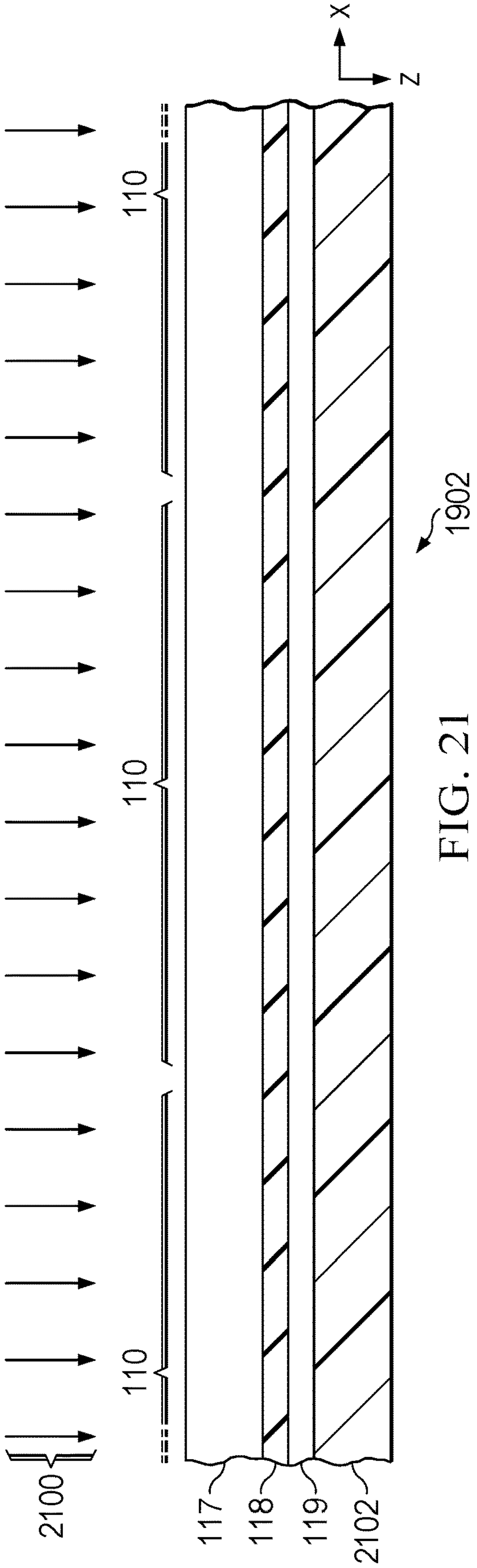

At 1805 in FIG. 18, the wafer 1902 is transferred from the back grind tape to a tape frame. FIG. 21 shows one example, in which a transfer process 2100 removes the processed wafer 1902 from the back grind tape carrier 2002 (e.g., FIG. 20 above), and installs the wafer 1902 with the top or second side on a tape frame 2102, such as a tray or carrier tape.

Figure 22:
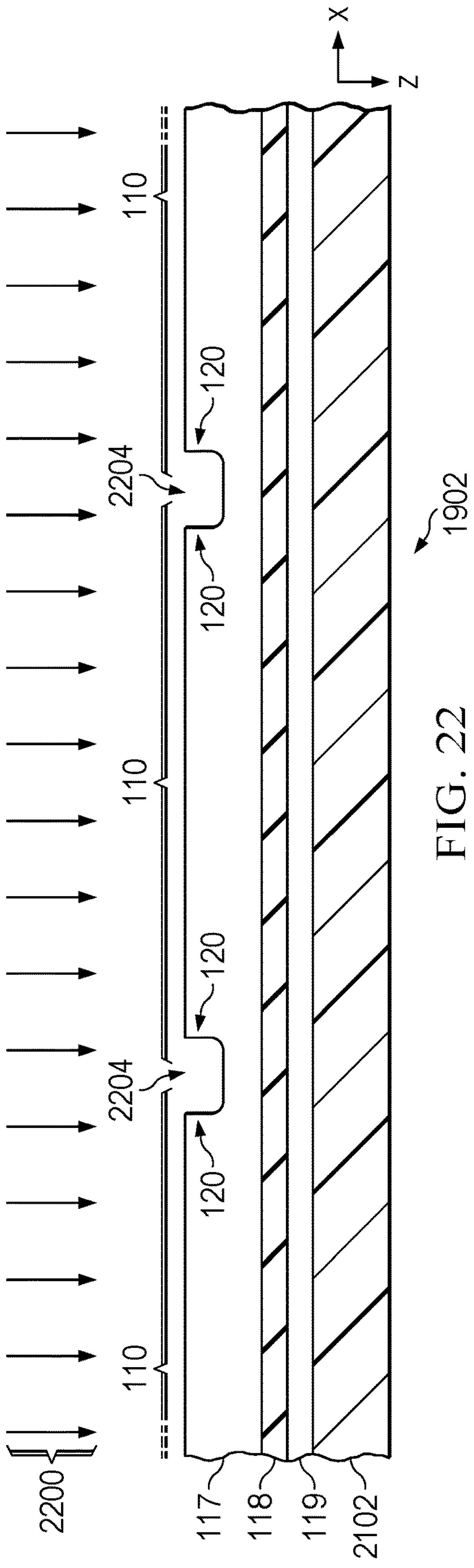

The method 1800 continues at 1806 in FIG. 18 with backside singulation to form trenches that extend into the previously ground back or first side of the wafer 1902. FIG. 22 shows one example, in which a trench formation process 2200 is performed with the top side of the wafer 1902 mounted to the tape frame 2102. The process 2200 forms trenches 2204 with a lateral width W that extend to a depth D into the back side of the wafer 1902. In one example, the trench formation process 2200 is or includes mechanical sawing. In another implementation, an etch process can be used to form the trenches 2204, such as a plasma etch. FIG. 22 further indicates the side portions of the trenches 2204 that form the prospective indents 120 of the subsequently separated individual semiconductor dies 110.

Figure 23:
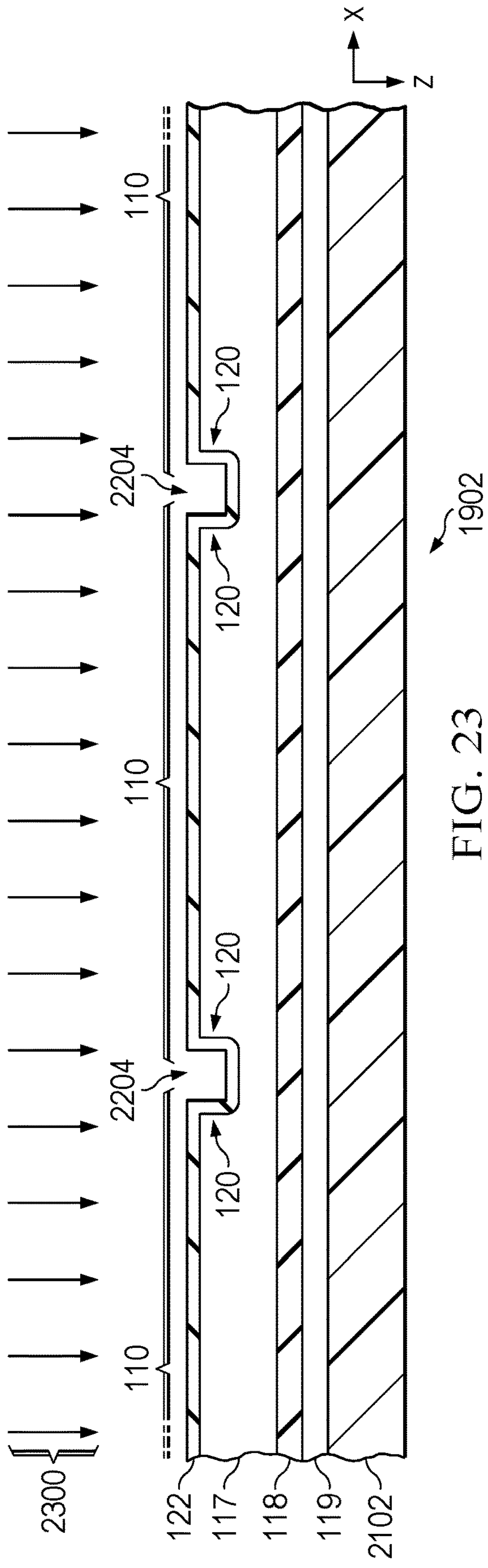

In first and second implementations, the method 1800 continues at 1808 in FIG. 18 with coating the back side of the wafer 1902 and the bottoms and sidewalls of the trenches 2204 at 1808 to form the electrical isolation coating layer 122. FIG. 23 shows one example, in which a deposition process 2300 is performed that forms the electrical isolation coating layer 122 on the back side of the wafer 1902 and on the bottoms and sidewalls of the trenches 2204. In one example, the deposition process 2300 forms the electrical isolation coating layer 122 to a thickness of approximately 0.1 μm or more and approximately 10 μm or less, such as approximately 2 μm or more and approximately 5 μm or less. Any suitable deposition process 2300 can be used to provide the electrical isolation coating layer 122 of a suitable material (e.g., $SiO_2$, parylene, polyimide, etc.) using a suitable deposition technique (e.g., CVD, VDP, selective spray coating, etc.) as described in connection with FIG. 7 above (e.g., at 308 in FIG. 3).

Figure 24:
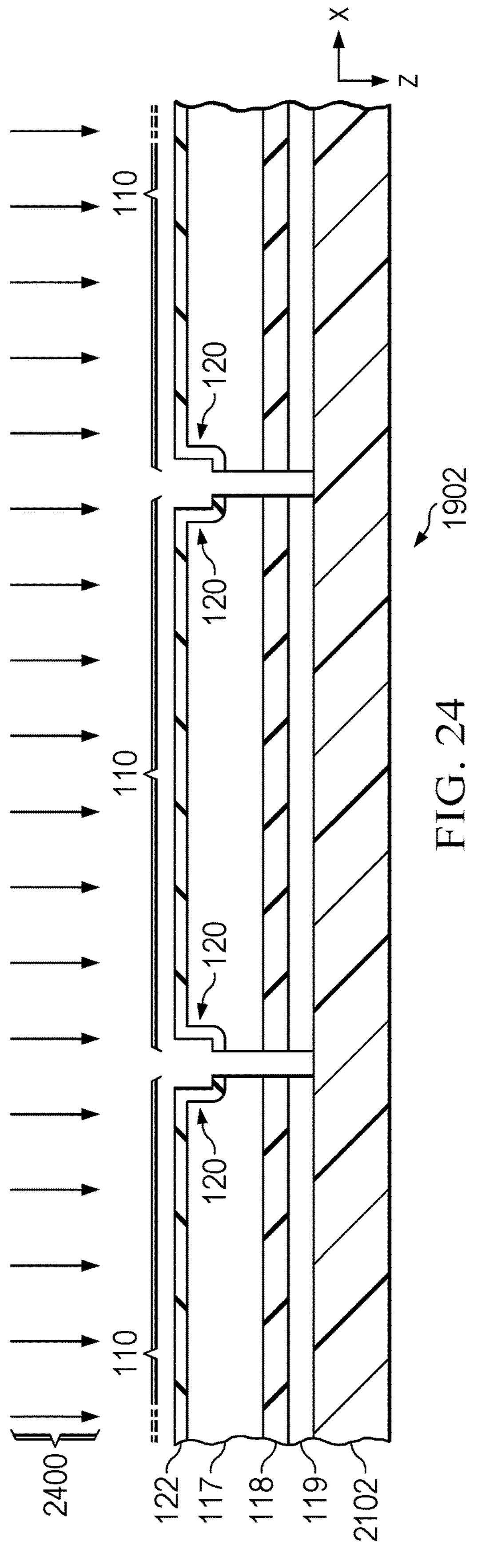

The first implementation of the method 1800 continues at 1810 in FIG. 18 with backside final singulation. FIG. 24 shows one example, in which a final singulation process 2400 is performed that separates individual semiconductor dies 110 from the starting wafer 1902. In one example, the singulation process 2400 is or includes laser dicing at 1810. In another example, a mechanical (e.g., sawing) cutting process can be used. In a further example, chemical etching can be used. The illustrated example performs laser dicing or cutting along the back side of the wafer 1902 while the top or front side of the wafer 1902 remains installed on the tape frame 2102. The process 2400 in one example at least partially separates individual unit areas from one another, for example, by creating cracks that extend the previously formed trenches 2204 downward and/or which create cracks beneath the bottoms of the trenches 2204 using a laser etching or cutting tool (not shown).

Figure 25:
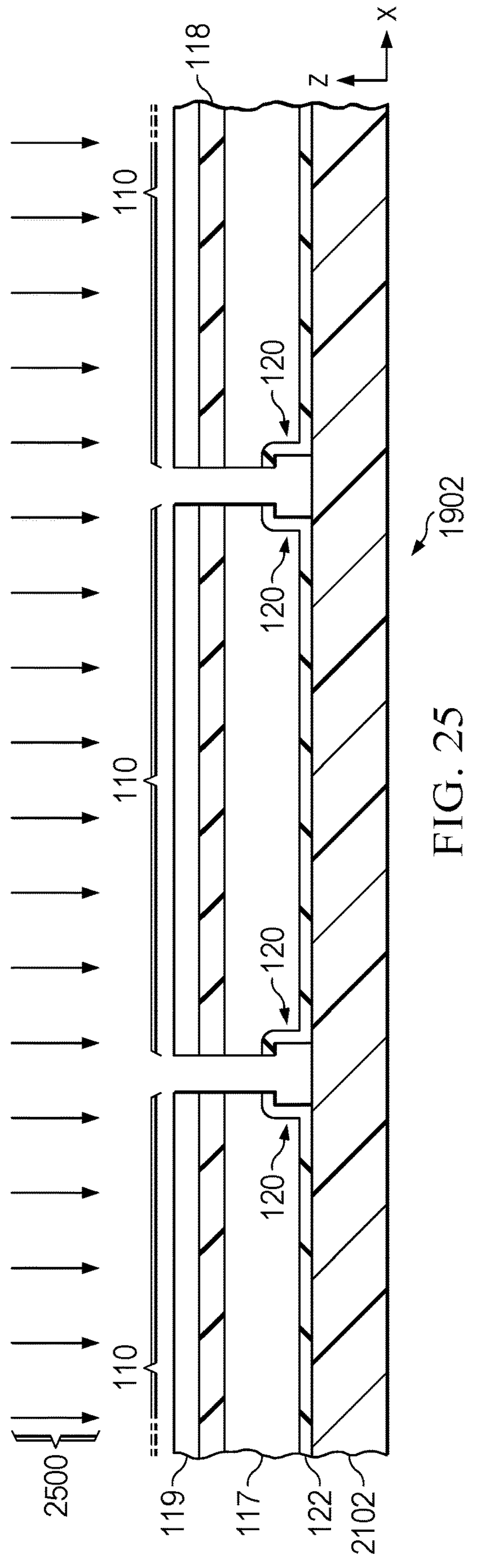
Figure 25A:
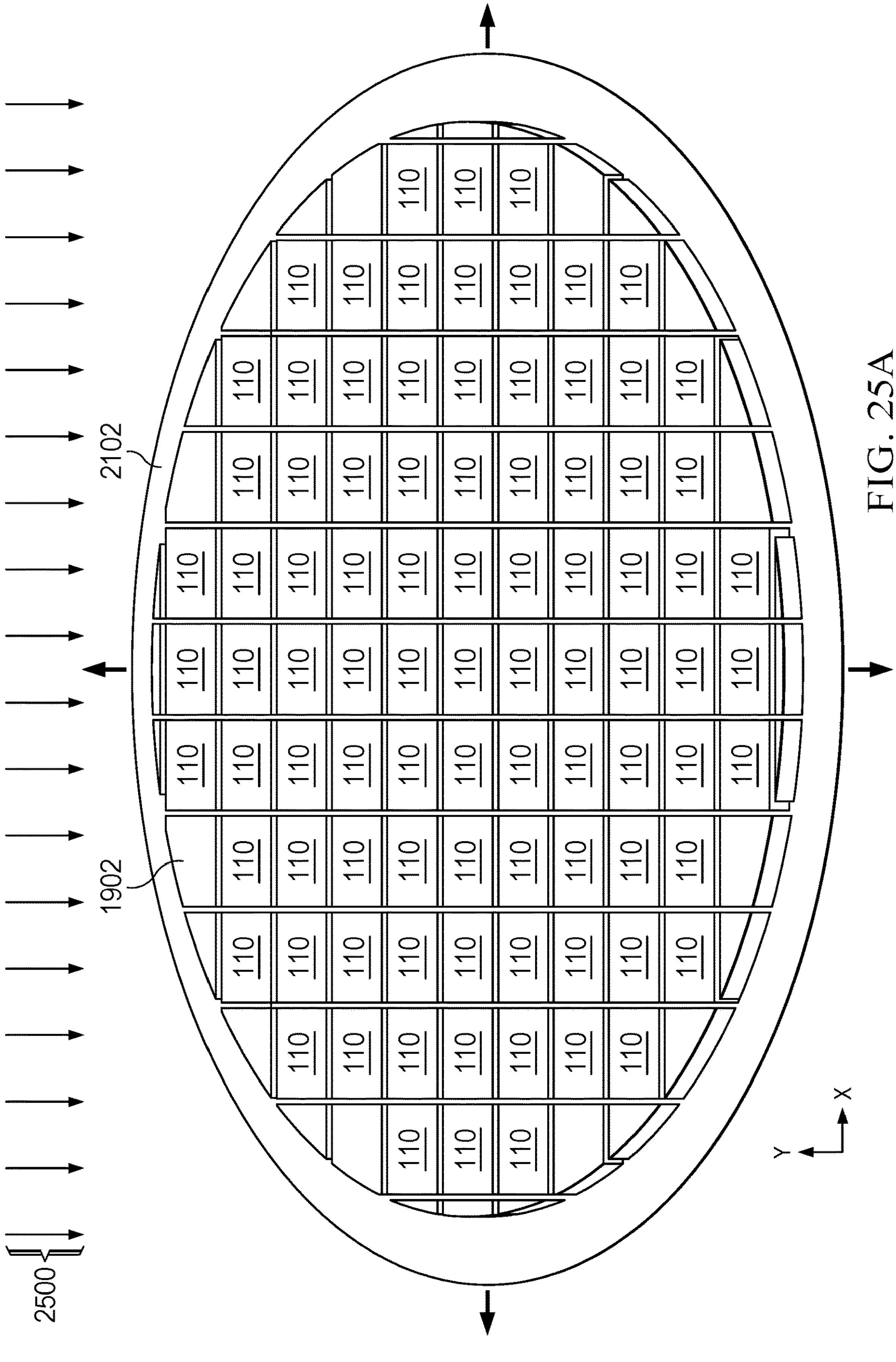

The first implementation continues at 1812 in FIG. 18 with expanding the tape frame to separate the individual semiconductor dies 110. FIGS. 25 and 25A show one example, in which an expansion or stretching process 2500 is performed that separates individual instances of the semiconductor die 110 from the wafer 1902. In one example, a wafer expander tool (not shown) is configured to support the wafer 1902 on the tape frame 2102 and stretch the tape frame 2102 radially outward in a plane of the first and second directions X and Y as best shown in FIG. 25A to mechanically separate individual dies 110 from the wafer 1902. The separation of the individual semiconductor dies 110 leaves the indents 120 along the bottom portions of the lateral sidewalls (e.g., FIGS. 1-1B above) coated with the electrical isolation coating layer 122. The individual separated semiconductor dies 110 have a portion of the initially formed first side of the wafer as well as an opposite second side with the previously formed conductive terminals on the second side, and the associated portion of the electrical isolation coating layer 122 that extends along the indent 120 and on the portion of the first side 111.

The method 1800 in the illustrated examples further includes packaging such as die attach processing at 1814, wire bonding or other electrical connection at 1816, molding at 1818, and package separation at 1820. Examples of suitable packaging processing are illustrated and described above in connection with FIGS. 11-14 (e.g., at 316, 318, 320, and 322 in FIG. 3 above) to complete the finished packaged electronic device 100 to finish fabrication of a packaged electronic device 100 with a conformal electrical isolation coating layer 122.

Figure 26:
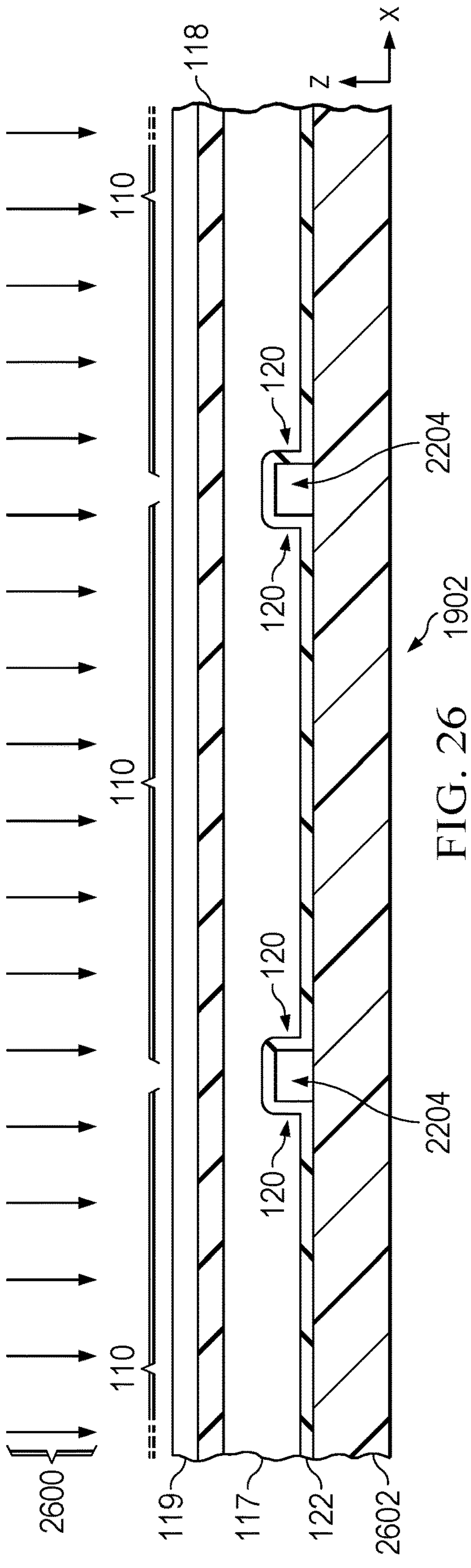
FIGS. 26 and 27 are sectional side elevation and top perspective views of an electronic device undergoing fabrication processing according to another example implementation of the method of FIG. 18.

A second implementation of the method 1800 continues after the coating at 1808 with transferring the wafer from a first tape frame to a second tape frame at 1822 in FIG. 18. FIG. 26 shows one example, in which a transfer process 2600 is performed that transfers the wafer 1902 from the first transfer tape 2102 (e.g., FIG. 23 above) and mounts the wafer 1902 with the first or backside of the wafer 1902 attached to a second transfer tape 2602.

Figure 27:
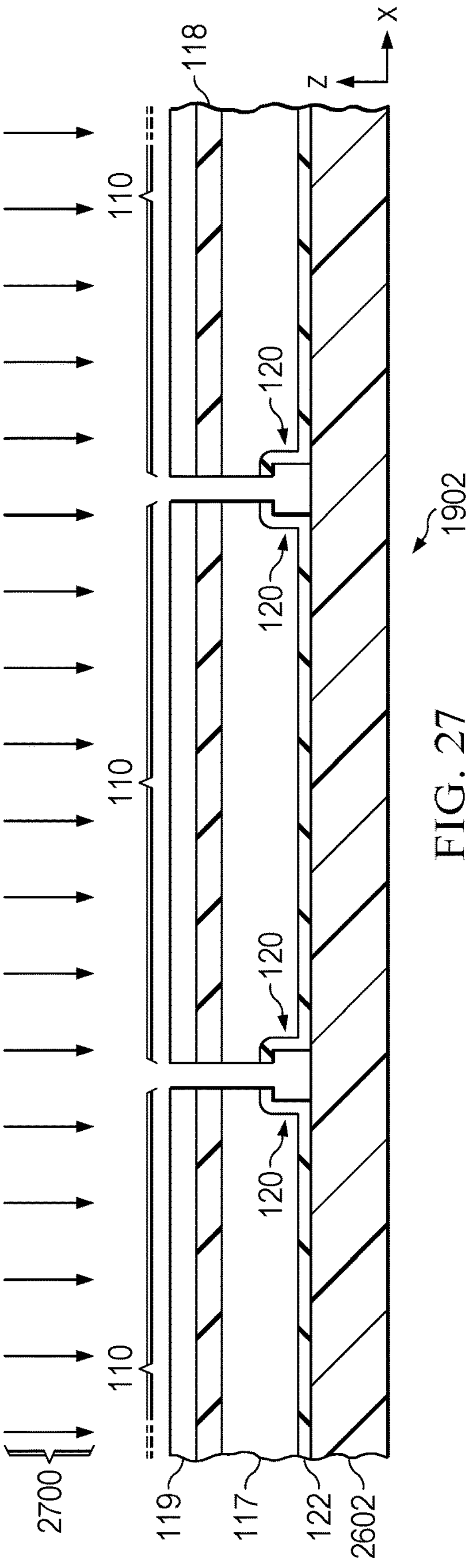

The second implementation continues at 1824 in FIG. 18 with singulation from the front side of the wafer 1902. FIG. 27 shows one example, in which a front side singulation process 2700 is performed that separates individual semiconductor dies 110 from the starting wafer 1902. In one example, the singulation process 2700 is or includes laser dicing at 1824. In another example, a mechanical (e.g., sawing) cutting process can be used that begins cutting on the front side of the wafer 1902 and cuts downward toward the previously formed trenches 2204. In a further example, chemical etching can be used. The process 2700 in one example at least partially separates individual unit areas from one another, for example, by creating cracks that extend behind the previously formed trenches 2204 and downward and/or which create cracks above the trenches 2204 using a laser etching or cutting tool (not shown). The second implementation of the method 1800 continues at 1812-1820 as previously described above in connection with the first implementation.

Figure 28:
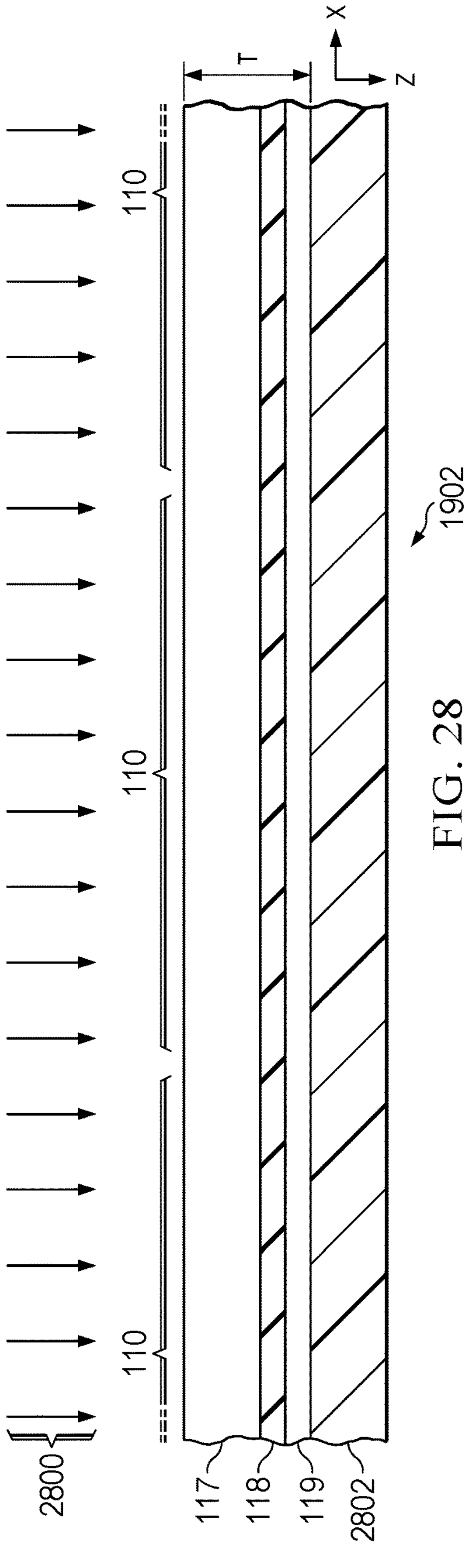
FIGS. 28-31 are sectional side elevation and top perspective views of an electronic device undergoing fabrication processing according to a further example implementation of the method of FIG. 18.

A third implementation of the method 1800 in FIG. 18 continues after the active circuitry and metallization structure formation at 1802 as described above, and includes mounting the wafer to a wafer carrier system at 1826 and a backside grind is performed at 1828. FIG. 28 shows one example, in which the wafer 1902 is mounted to a wafer carrier 2802. A back grinding process 2800 is performed in FIG. 28 that grinds a portion of the back or bottom side of the wafer 1902 while the top or front side of the wafer 1902 is mounted on the wafer carrier 2802. The back grinding process 2800 sets the semiconductor die thickness T shown in FIG. 28. The ultimately completed semiconductor die 110 in this example will have a thickness along the third direction Z of the ground die thickness T plus the thickness of the subsequently formed electrical isolation coating layer 122 as shown above in FIG. 1.

Figure 29:
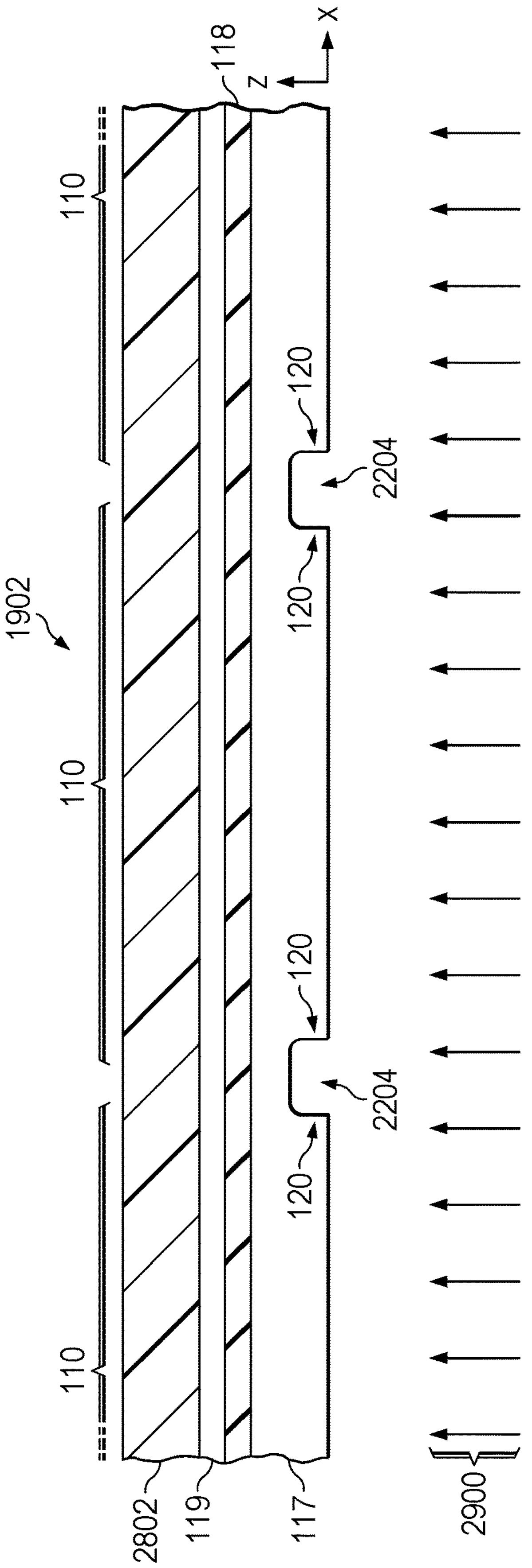

The third implementation of the method 1800 continues at 1829 in FIG. 18 with backside singulation to form trenches that extend into the previously ground back or first side of the wafer 1902. FIG. 29 shows one example, in which a trench formation process 2900 is performed with the top side of the wafer 1902 mounted to the wafer carrier 2802. The process 2900 forms trenches 2204. In one example, the trench formation process 2200 is or includes mechanical sawing. In another implementation, an etch process can be used to form the trenches 2204, such as a plasma etch. FIG. 29 further indicates the side portions of the trenches 2204 that form the prospective indents 120 of the subsequently separated individual semiconductor dies 110.

Figure 30:
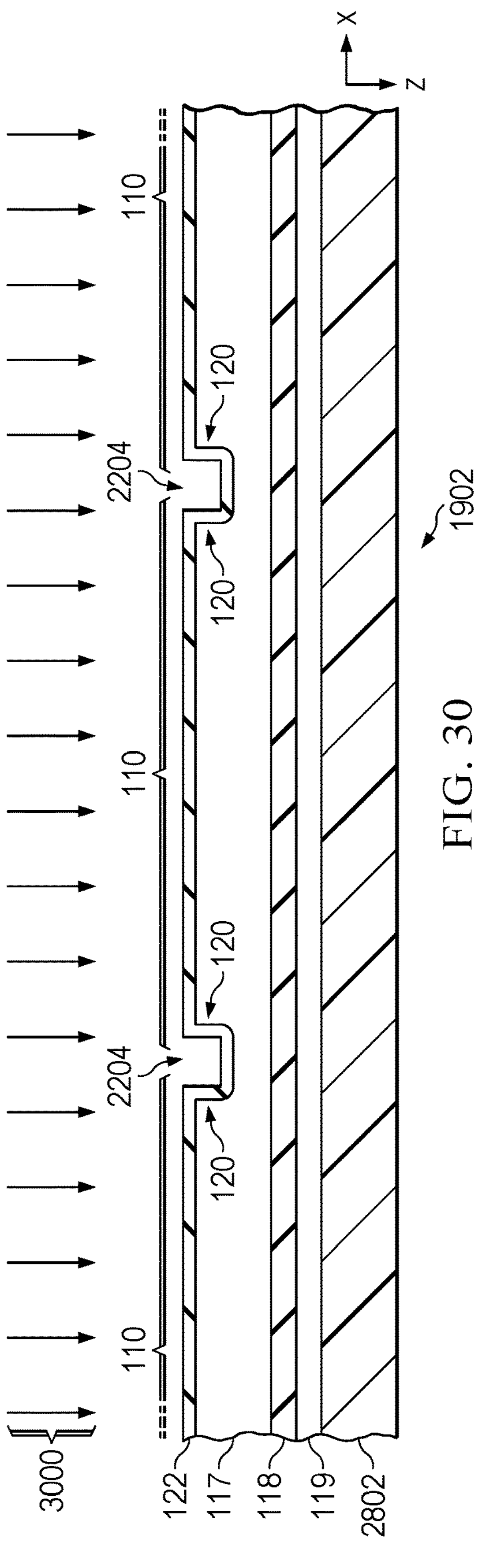

The third implementation continues at 1830 in FIG. 18 with coating the back side of the wafer 1902 and the bottoms and sidewalls of the trenches 2204 to form the electrical isolation coating layer 122. FIG. 30 shows one example, in which a deposition process 3000 is performed that forms the electrical isolation coating layer 122 on the back side of the wafer 1902 and on the bottoms and sidewalls of the trenches 2204. In one example, the deposition process 3000 forms the electrical isolation coating layer 122 to a thickness of approximately 0.1 μm or more and approximately 10 μm or less, such as approximately 2 μm or more and approximately 5 μm or less. Any suitable deposition process 3000 can be used to provide the electrical isolation coating layer 122 of a suitable material (e.g., $SiO_2$, parylene, polyimide, etc.) using a suitable deposition technique (e.g., CVD, VDP, selective spray coating, etc.) as described in connection with FIG. 7 above (e.g., at 308 in FIG. 3).

Figure 31:
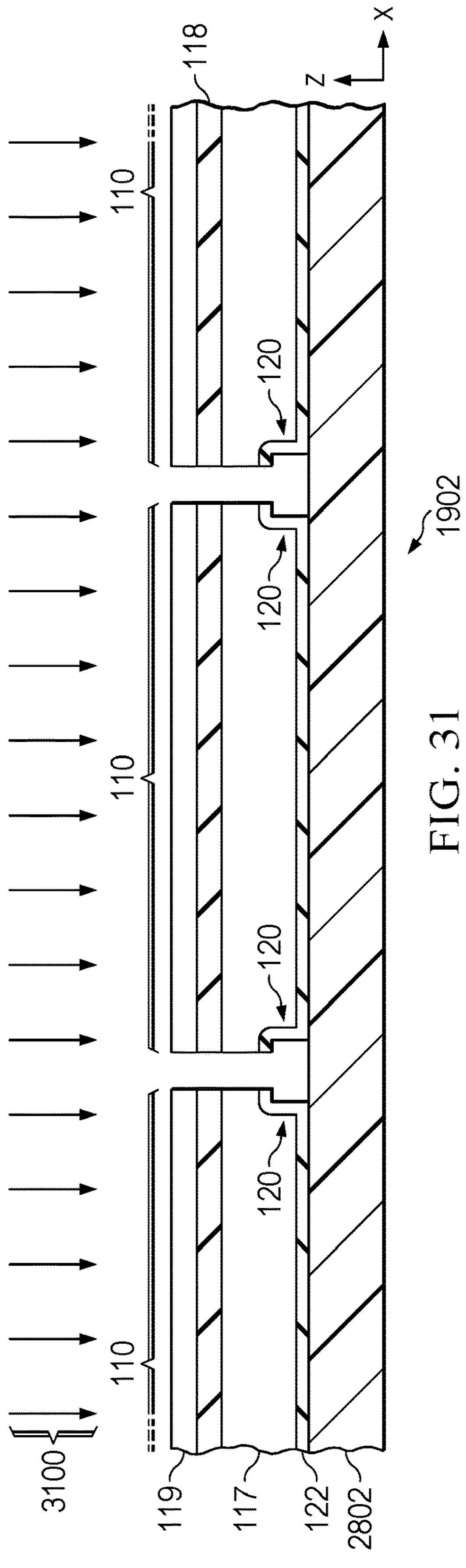

At 1832 in FIG. 18, the third implementation further includes front side singulation. FIG. 31 shows one example, in which a front side singulation process 3100 is performed that separates individual semiconductor dies 110 from the starting wafer 1902. In one example, the singulation process 3100 is or includes laser dicing at 1832. In another example, a mechanical (e.g., sawing) cutting process can be used that begins cutting on the front side of the wafer 1902 and cuts downward toward the previously formed trenches 2204. In a further example, chemical etching can be used. The process 3100 in one example at least partially separates individual unit areas from one another, for example, by creating cracks that extend behind the previously formed trenches 2204 and downward and/or which create cracks above the trenches 2204 using a laser etching or cutting tool (not shown). The third implementation of the method 1800 continues at 1812-1820 as previously described above in connection with the first implementation.

Referring now to FIGS. 32-39A, FIG. 32 shows another method 3200 of fabricating an electronic device with a conformal electrical isolation coating layer, and FIGS. 33-39A show the example electronic device 100 undergoing fabrication processing according to an example implementation of the method 3200. In other implementations, the example method 3200 can be used to form the electronic device 200 illustrated and described above in connection with FIGS. 2 and 2A.

Figure 33:
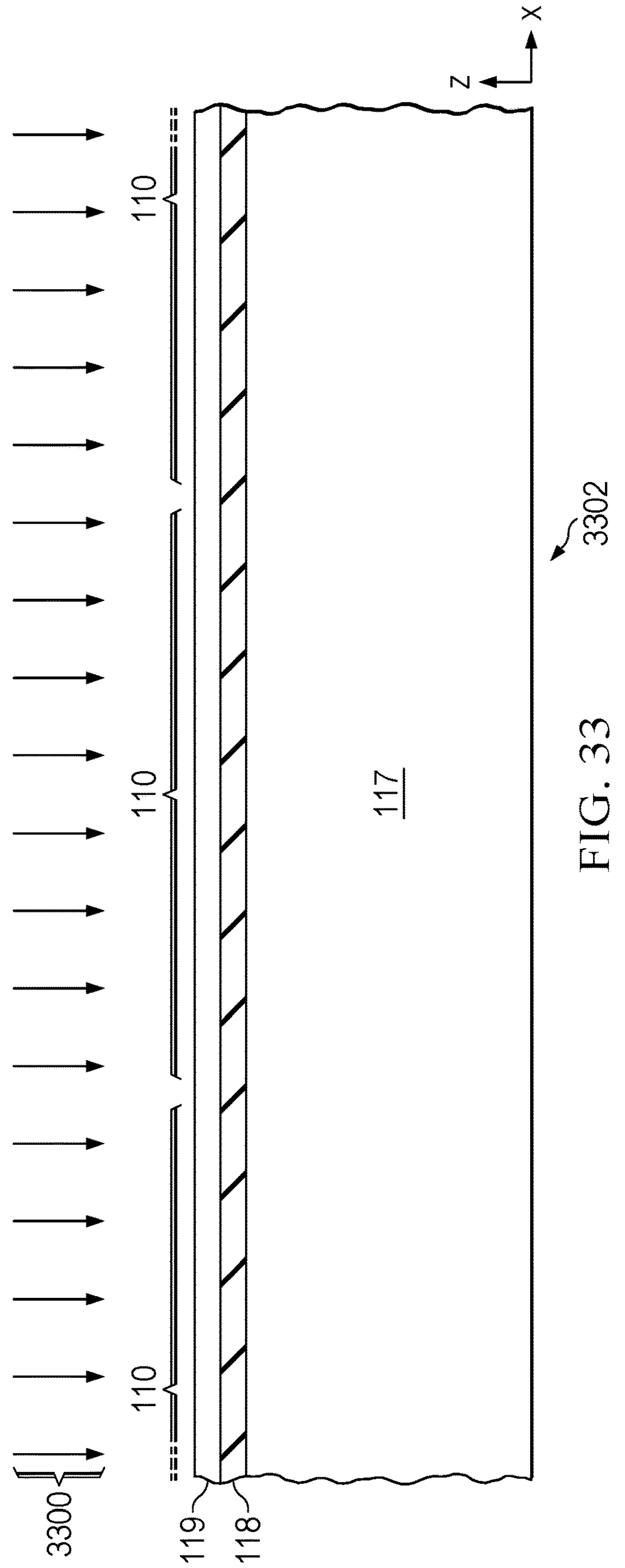
FIGS. 33-39A are sectional side elevation and top perspective views of an electronic device undergoing fabrication processing according to an example implementation of the method of FIG. 32.

The example method 3200 includes forming active circuitry and a metallization structure in individual unit areas of a starting wafer at 3202. The semiconductor wafer can be a silicon wafer, a silicon-on-insulator (SOI) substrate or other semiconductor structure (e.g., gallium arsenide, etc.). FIG. 33 shows one example of a starting SOI wafer 3302 undergoing fabrication processing 3300 that forms one or more electronic components in each individual unit area of the wafer 3302 and forms a metallization structure, for example, using the materials and processing described above in connection with FIG. 4 (e.g., at 302 in FIG. 3 above).

Figure 32:
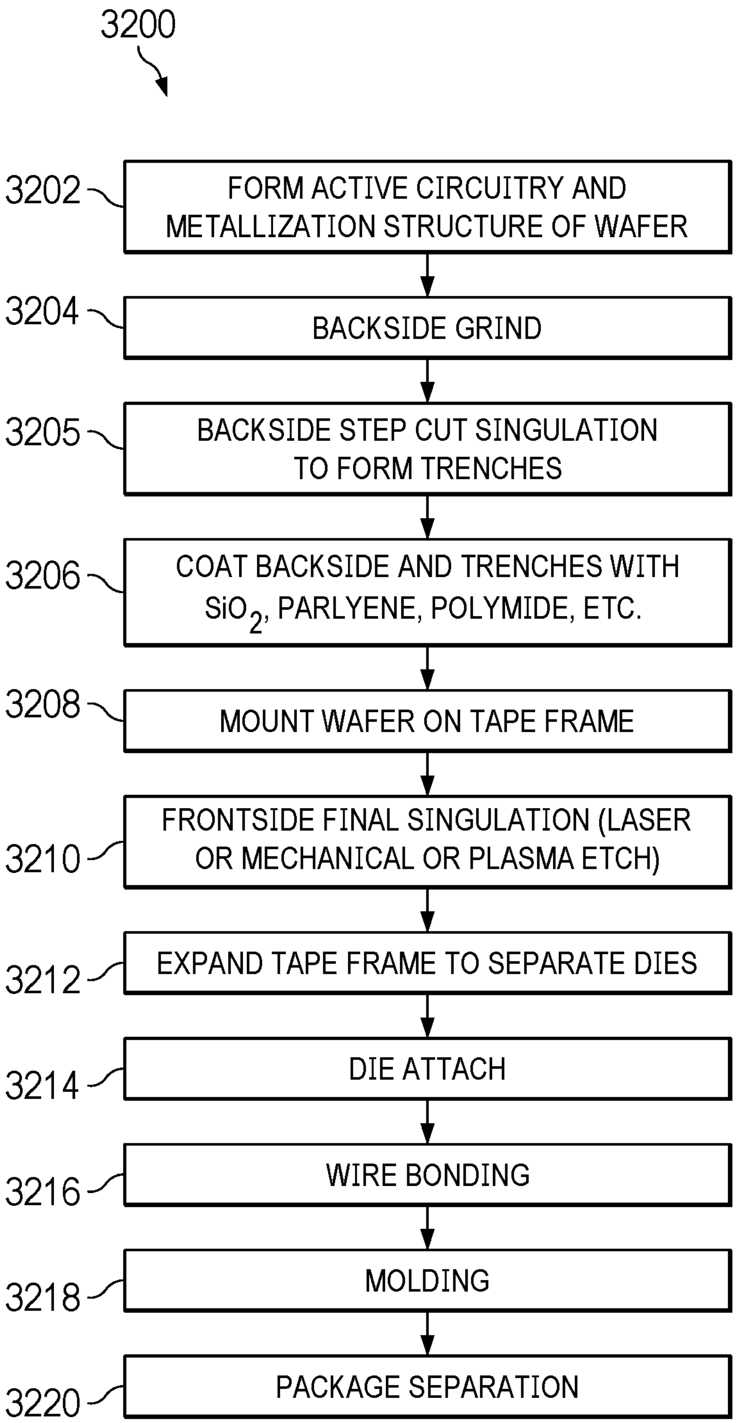
FIG. 32 is a flow diagram of another method of fabricating an electronic device with a conformal electrical isolation coating layer.
Figure 34:
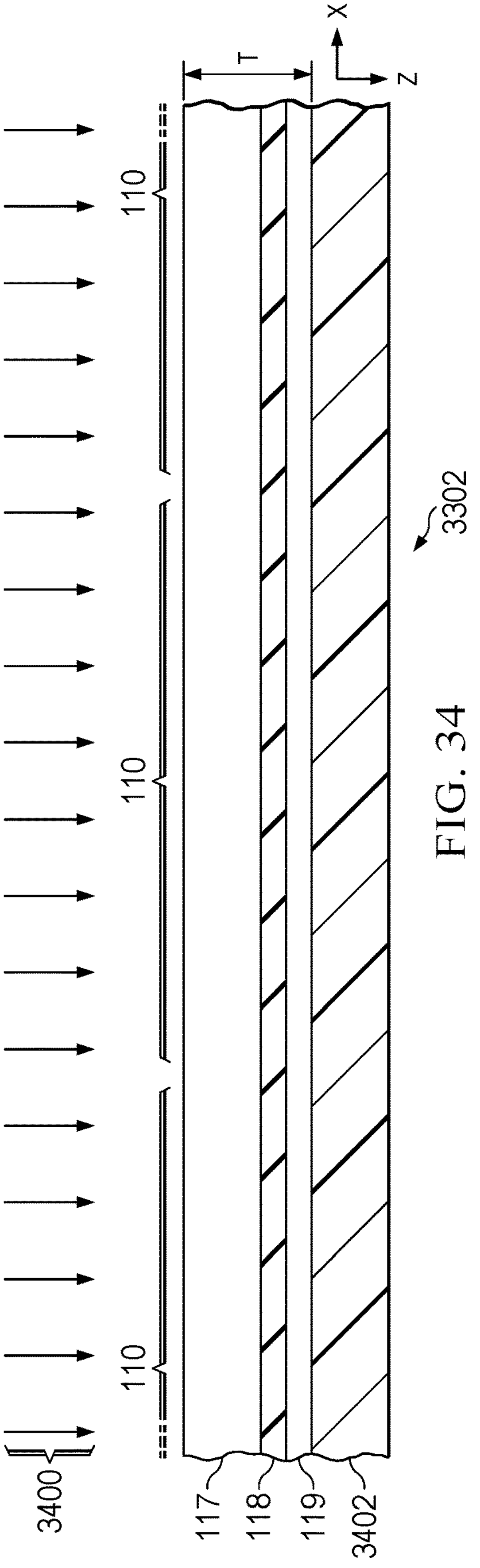

At 3204 in FIG. 32, the method 3200 includes backside grinding. FIG. 34 shows one example, in which a back grinding process 3400 is performed that grinds a portion of the back or bottom side of the wafer 3302 while the top or front side of the wafer 3302 is mounted on a back grind tape carrier 3402. The back grinding process 3400 sets a semiconductor die thickness T shown in FIG. 34. The ultimately completed semiconductor die 110 in this example will have a thickness along the third direction Z of the ground die thickness T plus the thickness of the subsequently formed electrical isolation coating layer 122 as shown above in FIG. 1.

Figure 35:
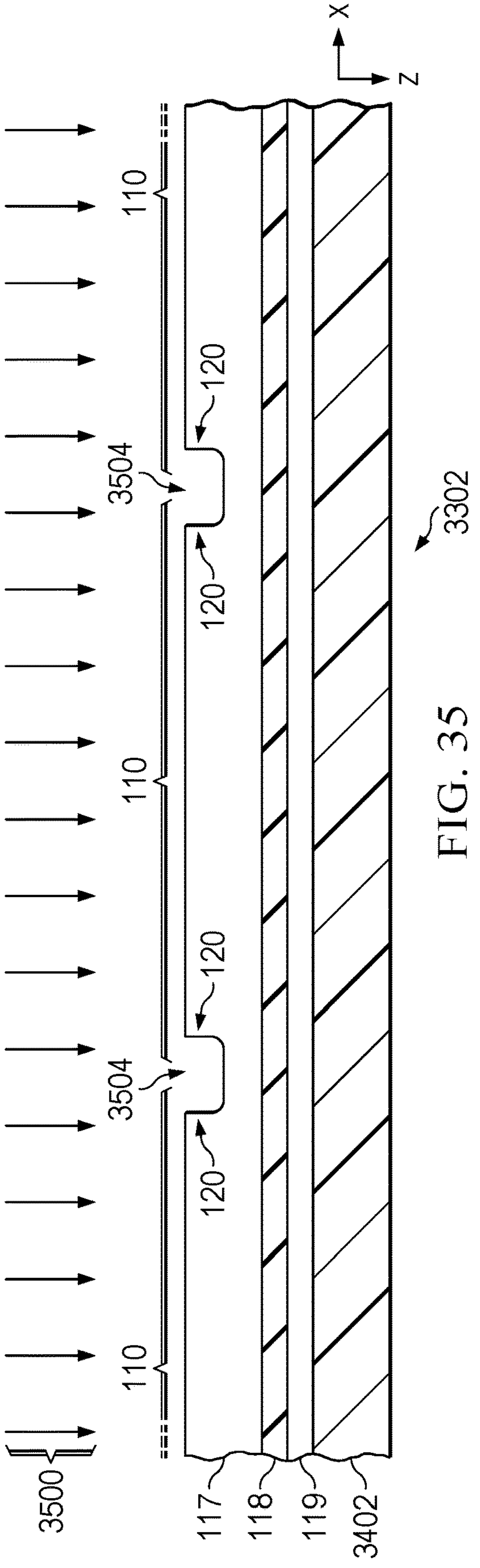

The method 3200 continues at 3205 in FIG. 32 with backside singulation to form trenches that extend into the previously ground back or first side of the wafer 3302. FIG. 35 shows one example, in which a trench formation process 3500 is performed with the top side of the wafer 3302 mounted to the tape frame 3402. The process 3500 forms trenches 3504 with a lateral width W that extend to a depth D into the back side of the wafer 3302. In one example, the trench formation process 3500 is or includes mechanical sawing. In another implementation, an etch process can be used to form the trenches 3504, such as a plasma etch. FIG. 35 further indicates the side portions of the trenches 3504 that form the prospective indents 120 of the subsequently separated individual semiconductor dies 110.

Figure 36:
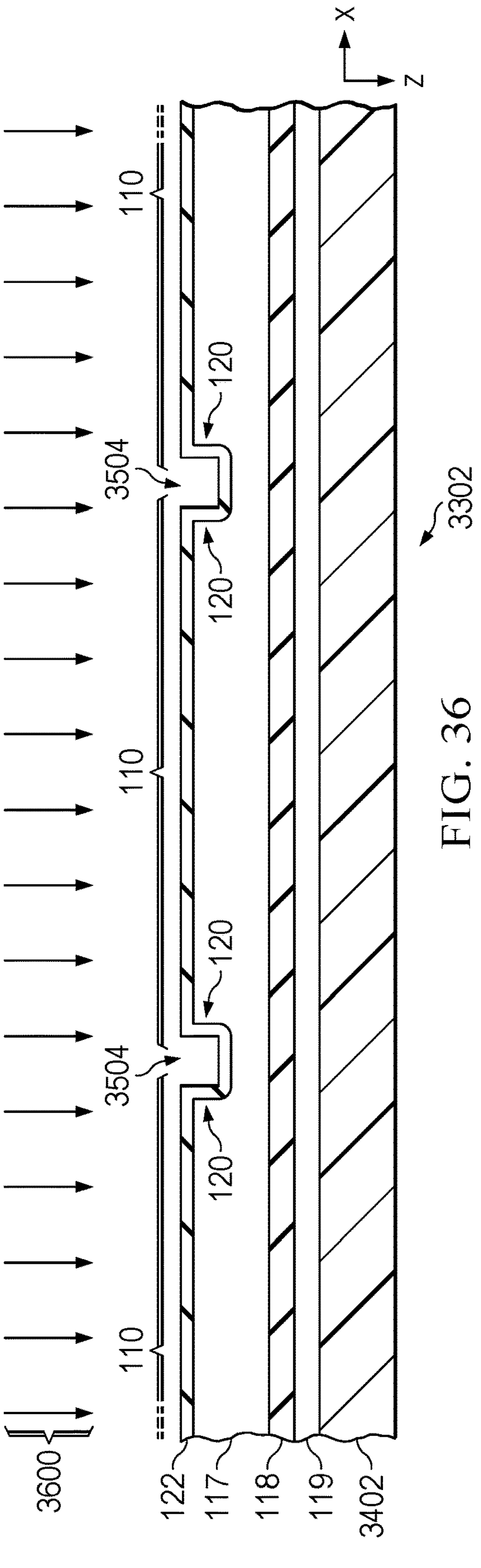

The method 3200 continues at 3206 in FIG. 32 with coating the back side of the wafer 3302 and the bottoms and sidewalls of the trenches 2204 at 1826 to form the electrical isolation coating layer 122. FIG. 36 shows one example, in which a deposition process 3600 is performed that forms the electrical isolation coating layer 122 on the back side of the wafer 3302 and on the bottoms and sidewalls of the trenches 3504. In one example, the deposition process 3600 forms the electrical isolation coating layer 122 to a thickness of approximately 0.1 μm or more and approximately 10 μm or less, such as approximately 2 μm or more and approximately 5 μm or less. Any suitable deposition process 3600 can be used to provide the electrical isolation coating layer 122 of a suitable material (e.g., $SiO_2$, parylene, polyimide, etc.) using a suitable deposition technique (e.g., CVD, VDP, selective spray coating, etc.) as described in connection with FIG. 7 above (e.g., at 308 in FIG. 3).

Figure 37:
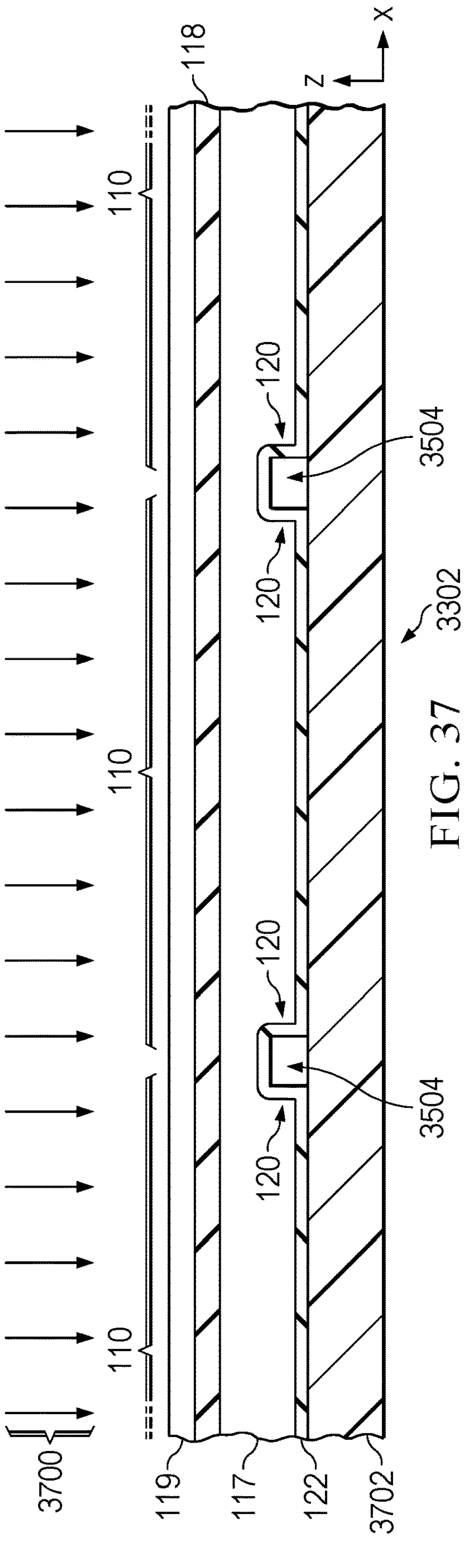
Figure 38:
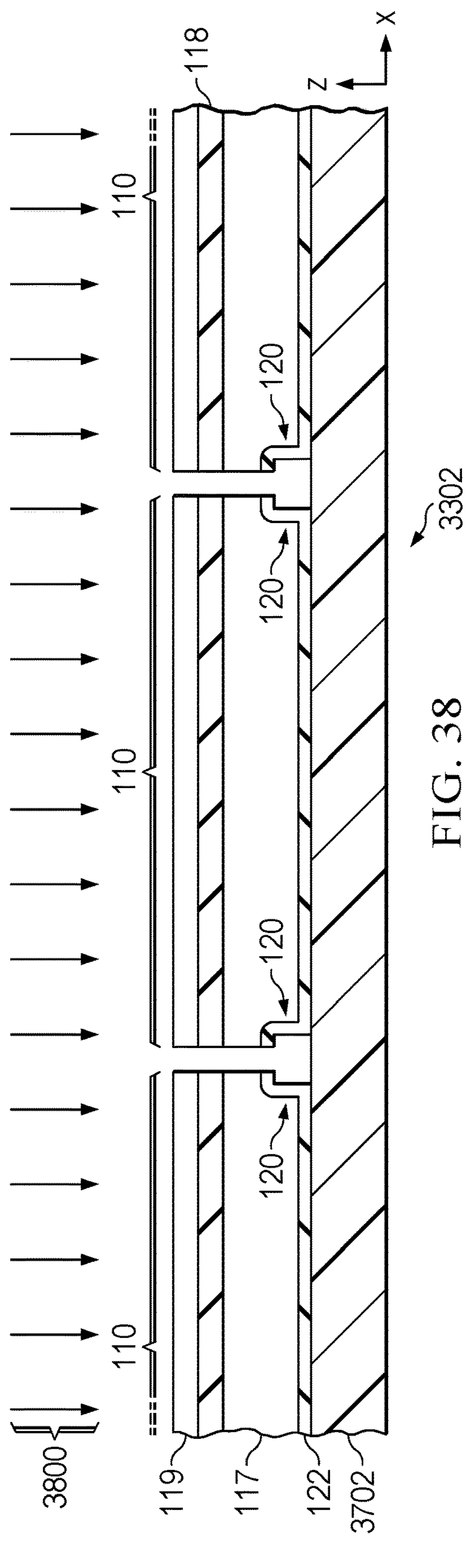

At 3208 in FIG. 32, the method 3200 includes mounting the wafer on a tape frame. FIG. 37 shows one example, in which a transfer process 3700 is performed, which attaches the back side of the wafer 3302 to a tape frame 3702. At 3210 in FIG. 32, front side singulation is performed, such as by laser or mechanical cutting or plasma etching or other suitable technique. FIG. 38 shows one example, in which a singulation process 3800 is performed on the front side of the wafer 3302. The front side singulation process 3800 in one example separates individual semiconductor dies 110 from the starting wafer 3302. In one example, the singulation process 3800 is or includes laser dicing. In another example, a mechanical (e.g., sawing) cutting process can be used that begins cutting on the front side of the wafer 3302 and cuts downward toward the previously formed trenches 3504. In a further example, chemical etching can be used. The process 3800 in one example at least partially separates individual unit areas from one another, for example, by creating cracks that extend behind the previously formed trenches 3504 and downward and/or which create cracks above the trenches 3504 using a laser etching or cutting tool (not shown).

Figure 39:
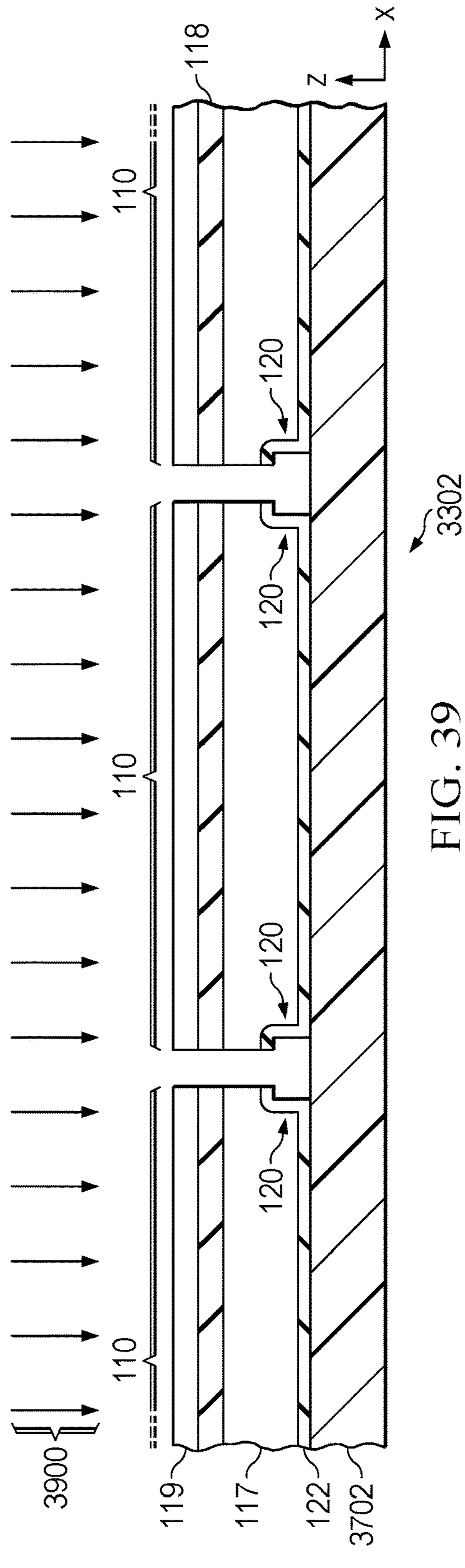
Figure 39A:
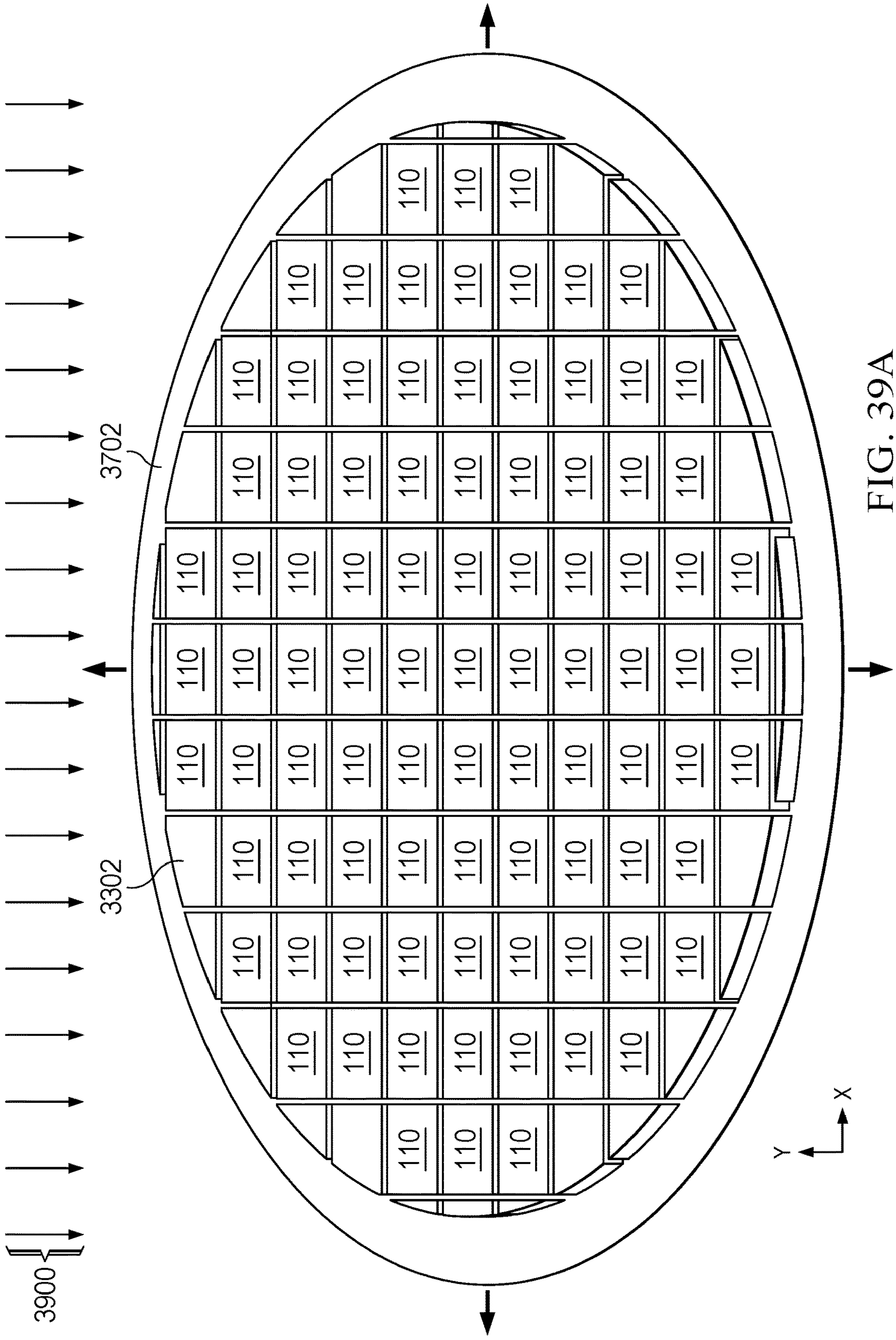

The method 3200 continues at 3212 in FIG. 32 with expanding the tape frame 3702 to separate the individual semiconductor dies 110 from the processed wafer 3302. FIGS. 39 and 39A show one example, in which an expansion or stretching process 3900 is performed that separates individual instances of the semiconductor die 110 from the wafer 3302. In one example, a wafer expander tool (not shown) is configured to support the wafer 3302 on the tape frame 2102 and stretch the tape frame 3702 radially outward in a plane of the first and second directions X and Y as best shown in FIG. 39A to mechanically separate individual dies 110 from the wafer 3302. The separation of the individual semiconductor dies 110 leaves the indents 120 along the bottom portions of the lateral sidewalls (e.g., FIGS. 1-1B above) coated with the electrical isolation coating layer 122. The individual separated semiconductor dies 110 have a portion of the initially formed first side of the wafer as well as an opposite second side with the previously formed conductive terminals on the second side, and the associated portion of the electrical isolation coating layer 122 that extends along the indent 120 and on the portion of the first side 111 as seen in FIGS. 1-1B above.

The method 3200 further includes packaging operations, such as die attach processing at 3214, wire bonding or other electrical connection at 3216, molding at 3218, and package separation at 3220. Examples of suitable packaging processing are illustrated and described above in connection with FIGS. 11-14 (e.g., at 316, 318, 320, and 322 in FIG. 3 above) to complete the finished packaged electronic device 100 to finish fabrication of a packaged electronic device 100 with a conformal electrical isolation coating layer 122.

Referring now to FIGS. 40-47A, FIG. 40 shows another method 4000 of fabricating an electronic device with a conformal electrical isolation coating layer using backside trench etching, and FIGS. 41-47A illustrate the example electronic device 200 undergoing fabrication processing according to an example implementation of the method 4000. In other implementations, the example method 4000 can be used to form the electronic device 100 illustrated and described above in connection with FIGS. 1-1B.

Figure 41:
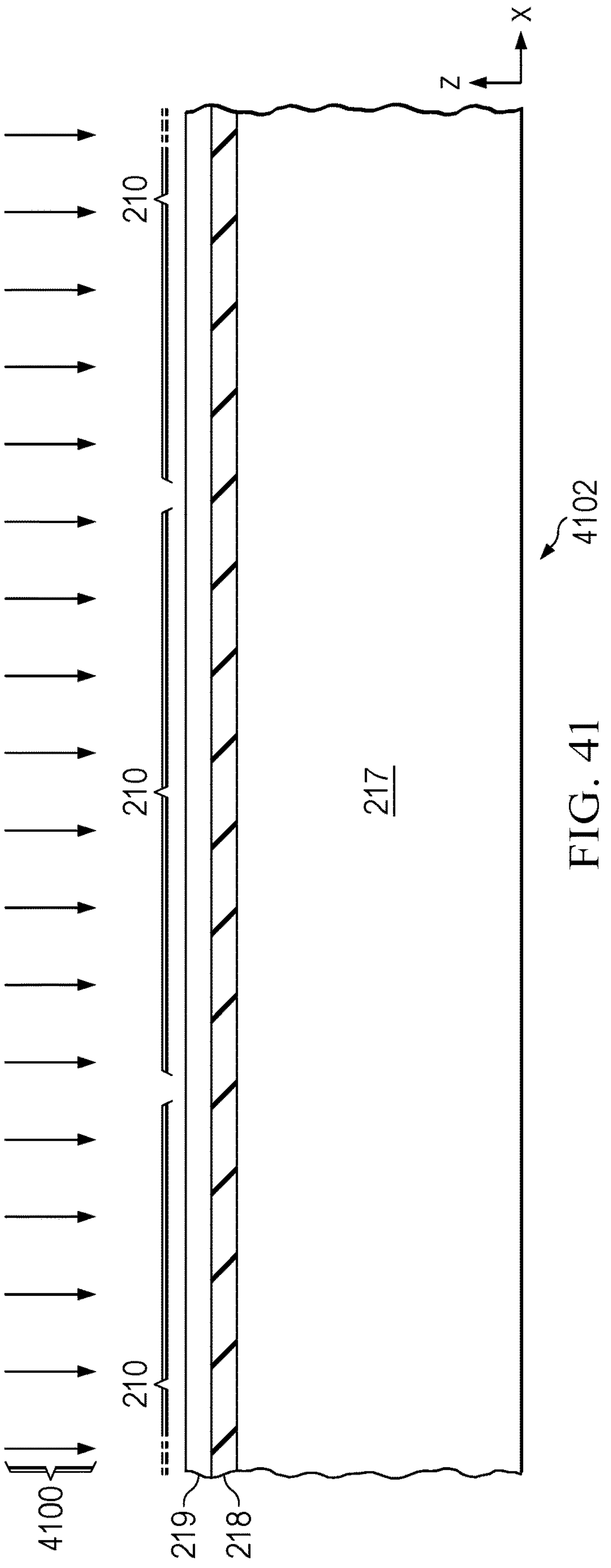
FIGS. 41-47A are sectional side elevation and top perspective views of an electronic device undergoing fabrication processing according to an example implementation of the method of FIG. 32.

The example method 4000 includes forming active circuitry and a metallization structure in individual unit areas of a starting wafer at 4002. The semiconductor wafer can be a silicon wafer, a silicon-on-insulator (SOI) substrate or other semiconductor structure (e.g., gallium arsenide, etc.). FIG. 41 shows one example of a starting SOI wafer 4102 undergoing fabrication processing 4100 that forms one or more electronic components in each individual unit area of the wafer 4102 and forms a metallization structure, for example, using the materials and processing described above in connection with FIG. 4 (e.g., at 302 in FIG. 3 above).

Figure 40:
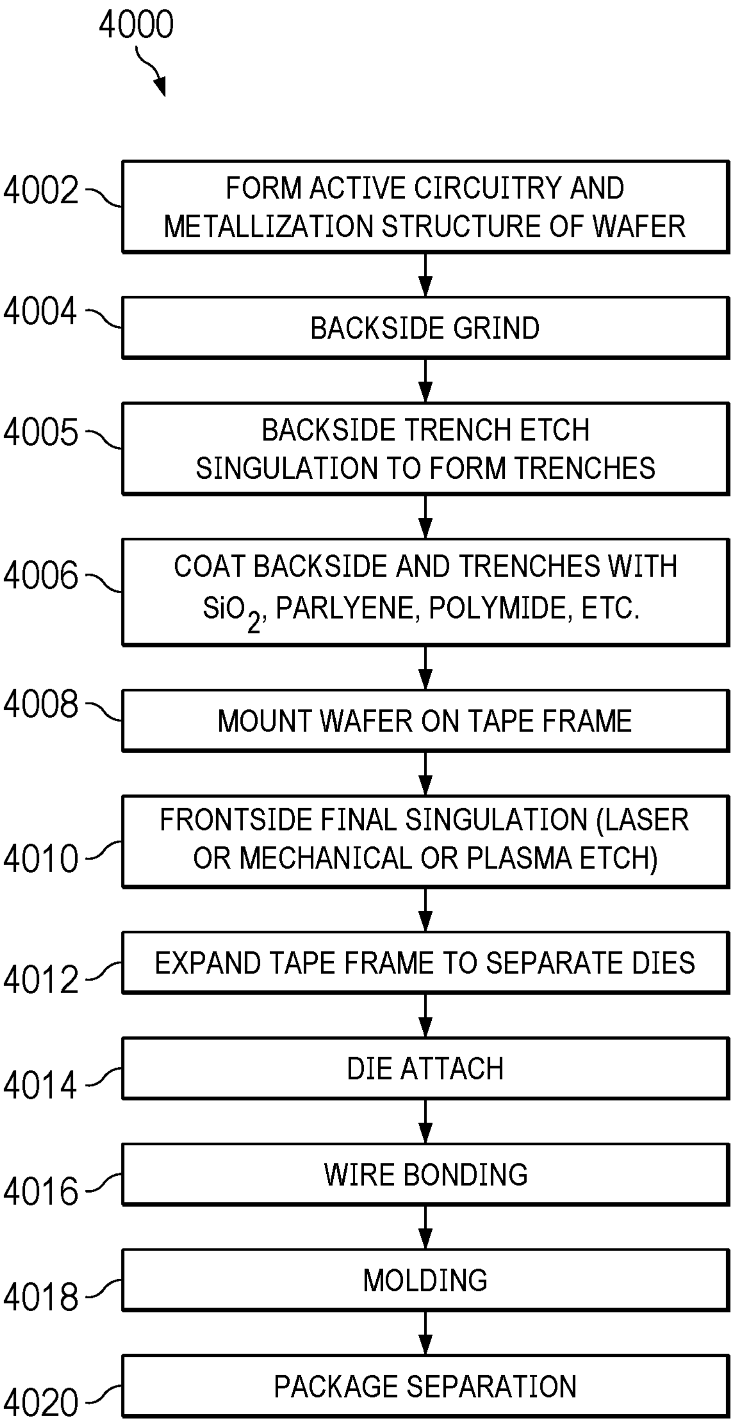
FIG. 40 is a flow diagram of another method of fabricating an electronic device with a conformal electrical isolation coating layer.
Figure 42:
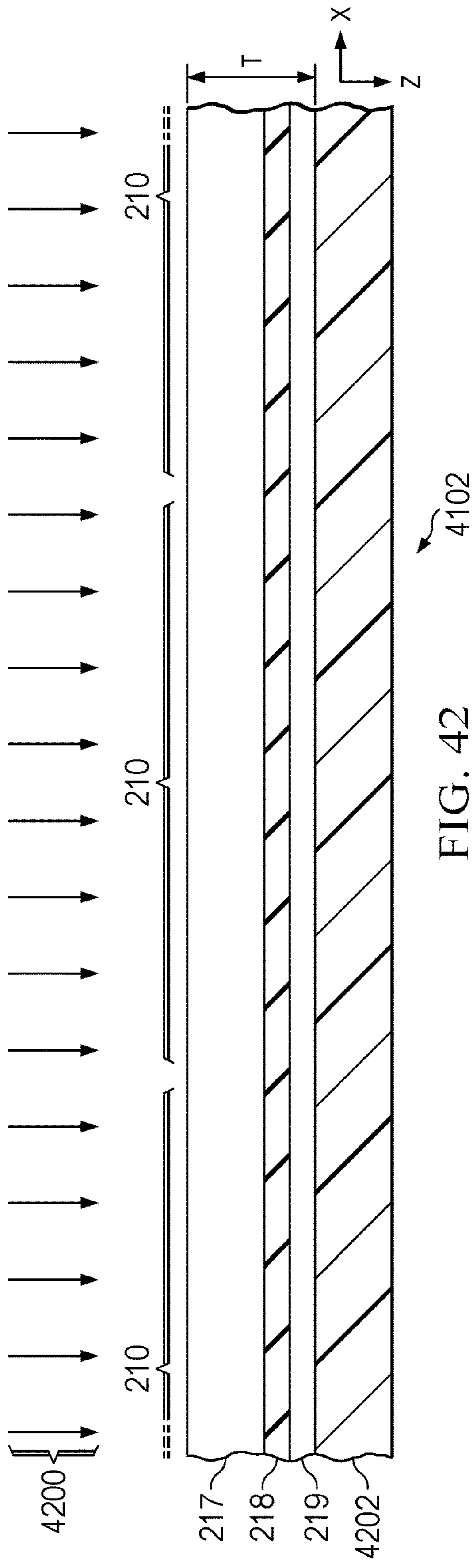

At 4004 in FIG. 40, the method 4000 includes backside grinding. FIG. 42 shows one example, in which a back grinding process 4200 is performed that grinds a portion of the back or bottom side of the wafer 4102 while the top or front side of the wafer 4102 is mounted on a back grind tape carrier 4202. The back grinding process 4200 sets a semiconductor die thickness T shown in FIG. 42. The ultimately completed semiconductor die 210 in this example will have a thickness along the third direction Z of the ground die thickness T plus the thickness of the subsequently formed electrical isolation coating layer 222 as shown above in FIG. 2.

Figure 43:
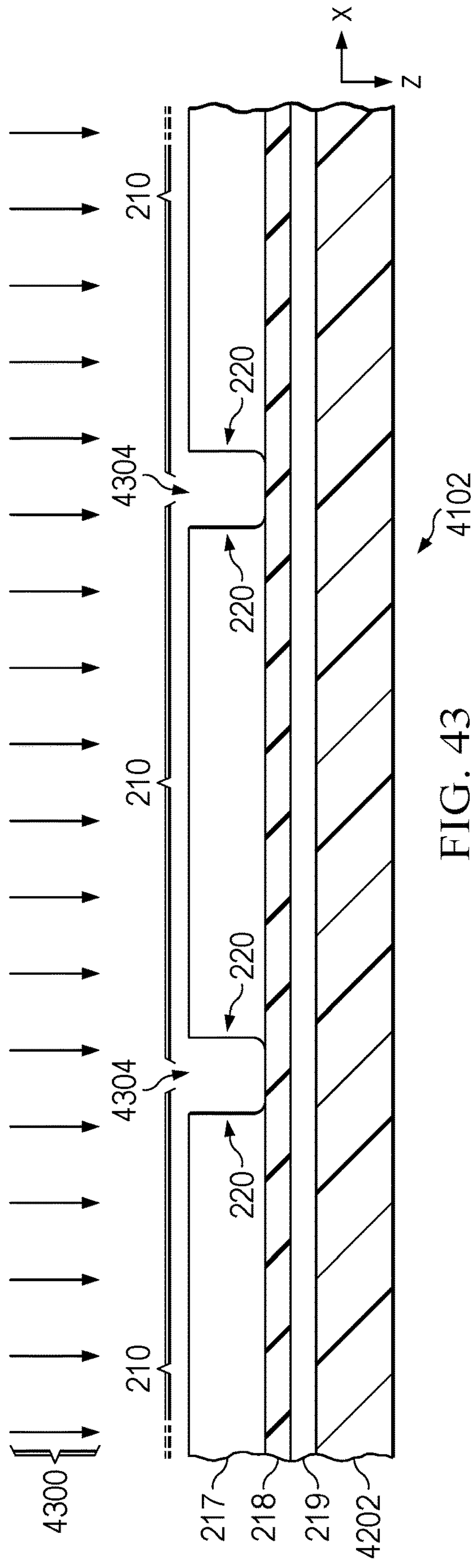

The method 4000 continues at 4005 in FIG. 40 with backside trench etch singulation to form trenches that extend into the previously ground back or first side of the wafer 4102. FIG. 43 shows one example, in which a trench etch process 4300 is performed with the top side of the wafer 4102 mounted to the tape frame 4202 and an etch mask parentheses not shown) that exposes the prospective trench areas of the bottom base portion 217 of the wafer 4102. The example backside trench etch singulation processing at 4005 can be advantageously employed in fabricating the electronic device 200 shown and described above in connection with FIGS. 2 and 2A, with the etch process 4300 reliably etching through the base portion 217 of the wafer 4102 and stopping at the isolation layer 218 using suitably selective etch chemistry of the etch process 4300.

Figure 44:
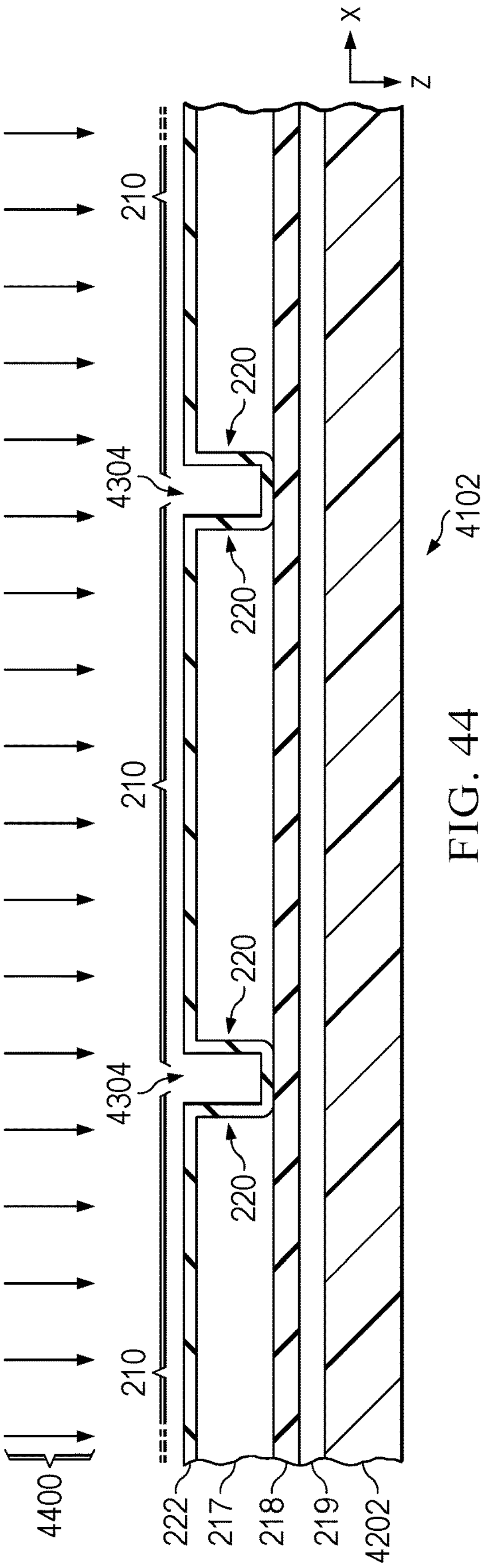

The method 4000 continues at 4006 in FIG. 40 with coating the back side of the wafer 4102 and the bottoms and sidewalls of the trenches 2204 at 1826 to form the electrical isolation coating layer 222. FIG. 44 shows one example, in which a deposition process 4400 is performed that forms the electrical isolation coating layer 222 on the back side of the wafer 4102 and on the bottoms and sidewalls of the trenches 4304. In one example, the deposition process 4400 forms the electrical isolation coating layer 222 to a thickness of approximately 0.1 μm or more and approximately 10 μm or less, such as approximately 2 μm or more and approximately 5 μm or less. Any suitable deposition process 4400 can be used to provide the electrical isolation coating layer 222 of a suitable material (e.g., $SiO_2$, parylene, polyimide, etc.) using a suitable deposition technique (e.g., CVD, VDP, selective spray coating, etc.) as described in connection with FIG. 7 above (e.g., at 308 in FIG. 3).

Figure 45:
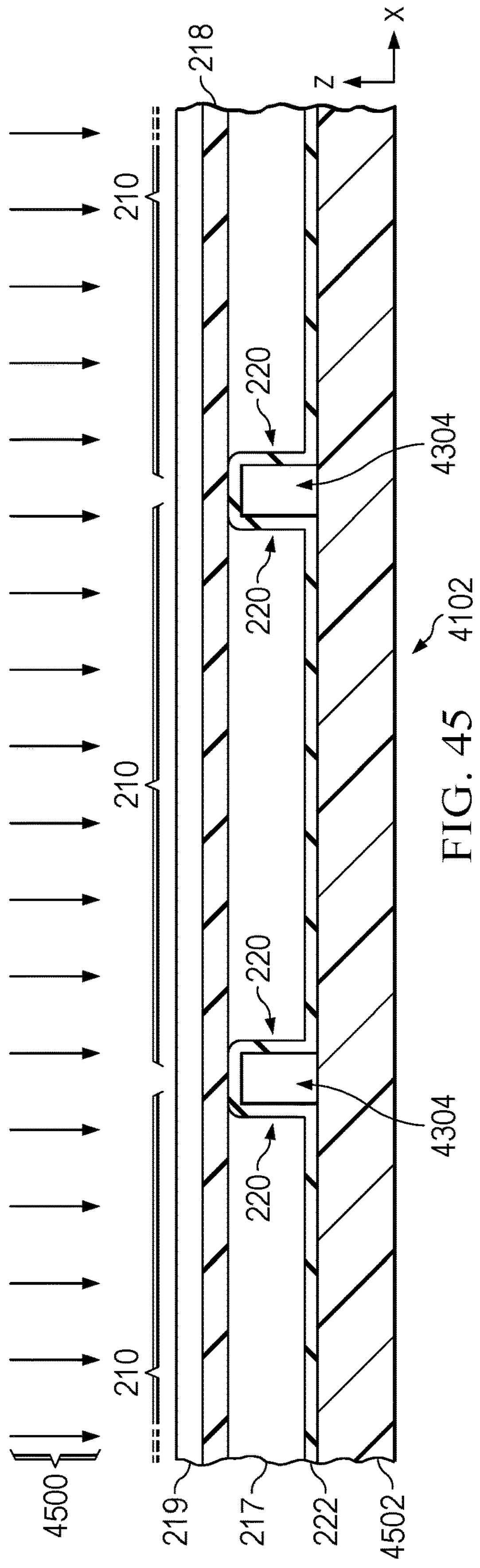
Figure 46:
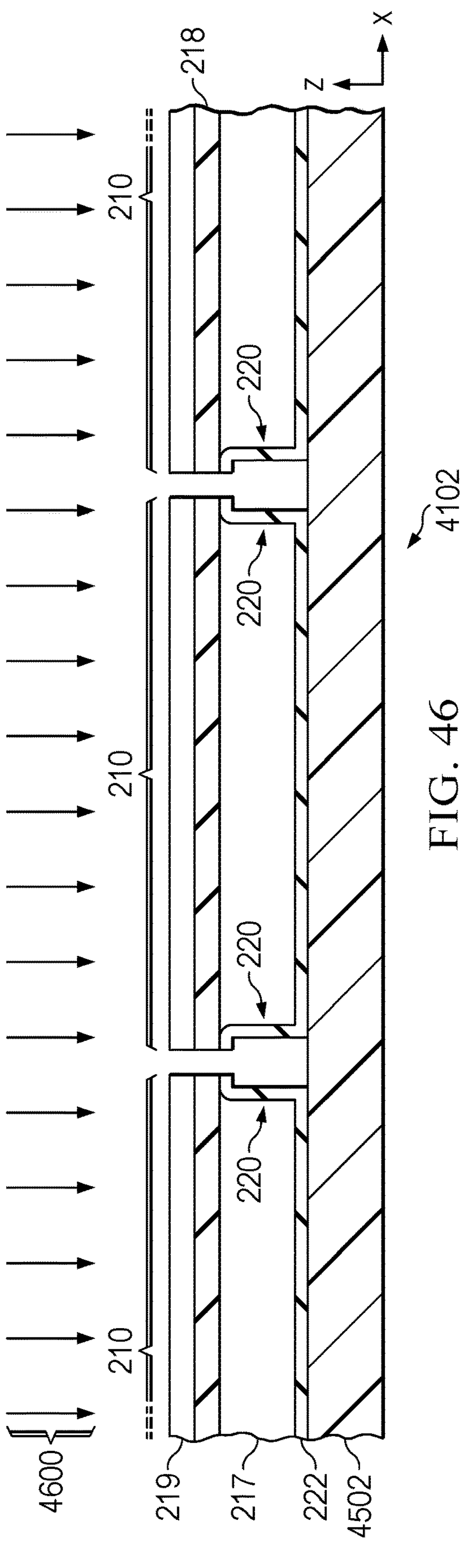

At 4008 in FIG. 40, the method 4000 includes mounting the wafer on a tape frame. FIG. 45 shows one example, in which a transfer process 4500 is performed, which attaches the back side of the wafer 4102 to a tape frame 4502. At 4010 in FIG. 40, front side singulation is performed, such as by laser or mechanical cutting or plasma etching or other suitable technique. FIG. 46 shows one example, in which a singulation process 4600 is performed on the front side of the wafer 4102. The front side singulation process 4600 in one example separates individual semiconductor dies 210 from the starting wafer 4102. In one example, the singulation process 4600 is or includes laser dicing. In another example, a mechanical (e.g., sawing) cutting process can be used that begins cutting on the front side of the wafer 4102 and cuts downward toward the previously formed trenches 4304. In a further example, chemical etching can be used. The process 4600 in one example at least partially separates individual unit areas from one another, for example, by creating cracks that extend behind the previously formed trenches 4304 and downward and/or which create cracks above the trenches 4304 using a laser etching or cutting tool (not shown).

Figure 47:
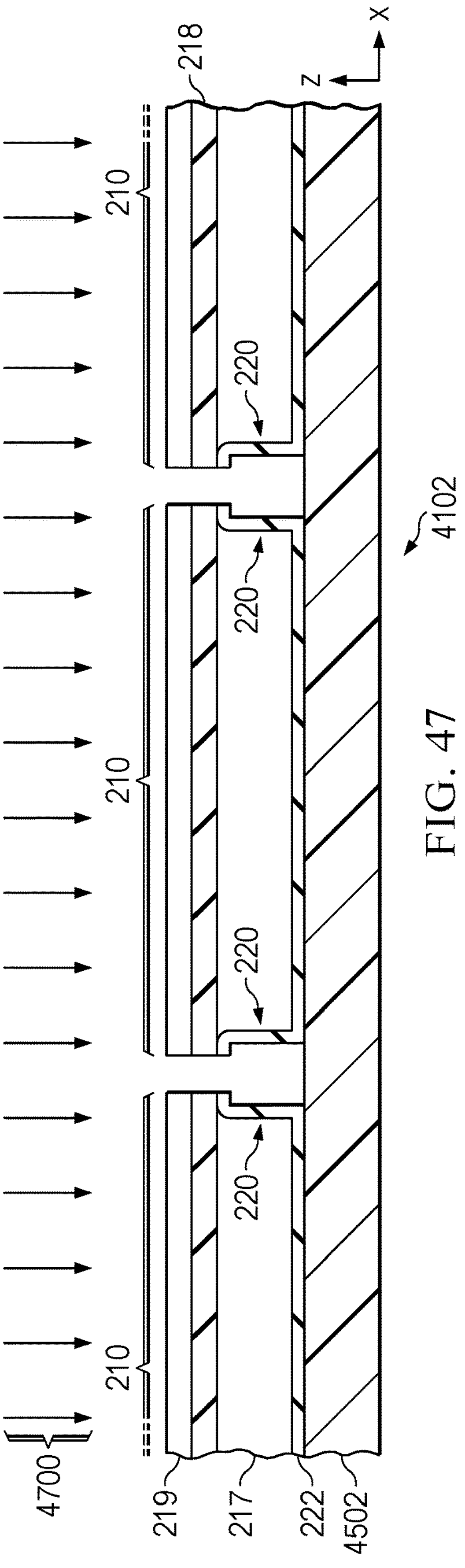
Figure 47A:
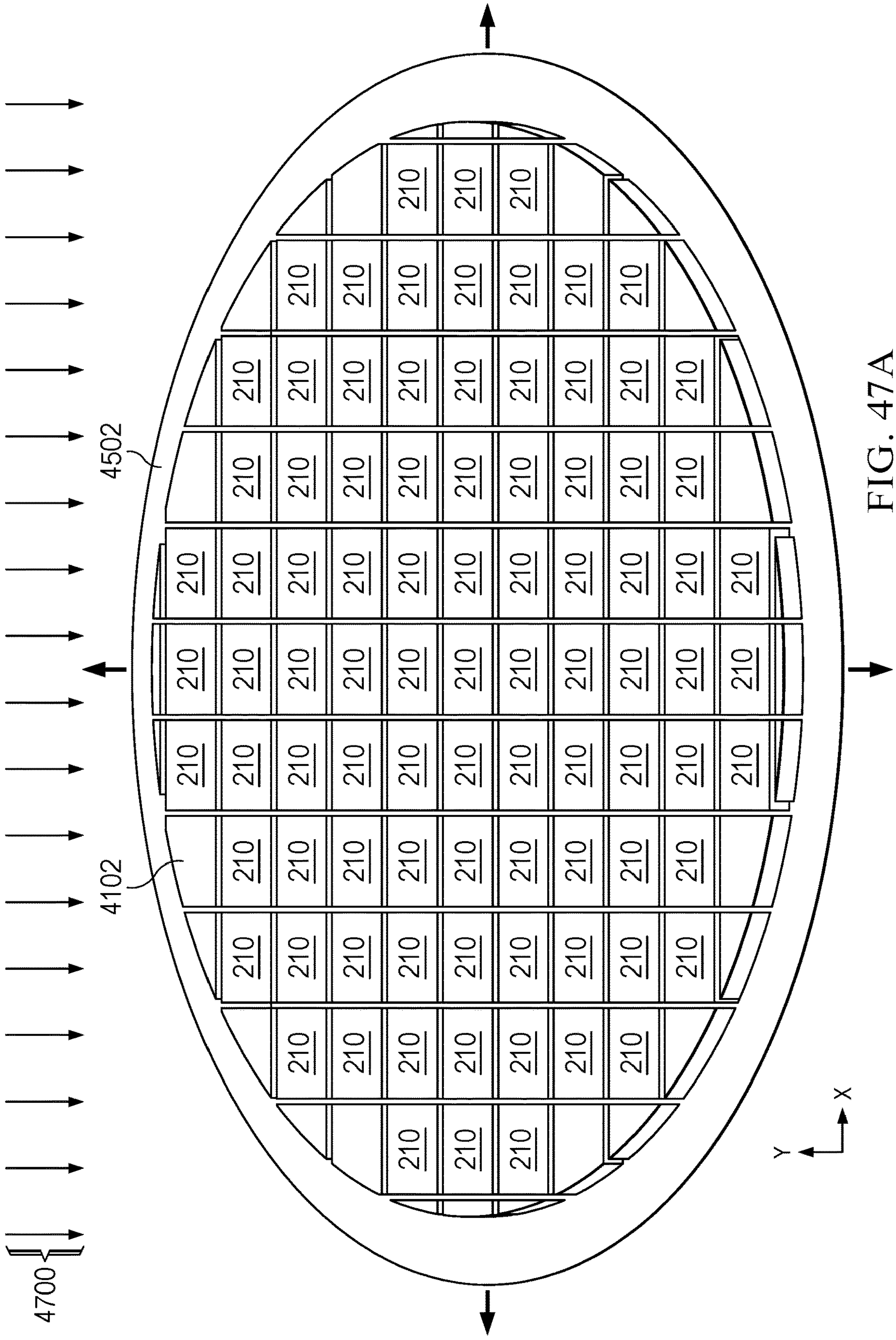

The method 4000 continues at 4012 in FIG. 40 with expanding the tape frame 4502 to separate the individual semiconductor dies 210 from the processed wafer 4102. FIGS. 47 and 47A a show one example, in which an expansion or stretching process 4700 is performed that separates individual instances of the semiconductor die 210 from the wafer 4102. In one example, a wafer expander tool (not shown) is configured to support the wafer 4102 on the tape frame 2102 and stretch the tape frame 4502 radially outward in a plane of the first and second directions X and Y as best shown in FIG. 47A to mechanically separate individual dies 210 from the wafer 4102. The separation of the individual semiconductor dies 210 leaves the indents 220 along the bottom portions of the lateral sidewalls (e.g., FIGS. 2 and 2A above) coated with the electrical isolation coating layer 222. The individual separated semiconductor dies 210 have a portion of the initially formed first side of the wafer as well as an opposite second side with the previously formed conductive terminals on the second side, and the associated portion of the electrical isolation coating layer 222 that extends along the indent 220 and on the portion of the first side 211 as seen in FIGS. 2 and 2A.

The method 4000 further includes packaging operations, such as die attach processing at 4014, wire bonding or other electrical connection at 4016, molding at 4018, and package separation at 4020. Examples of suitable packaging processing are illustrated and described above in connection with FIGS. 11-14 (e.g., at 316, 318, 320, and 322 in FIG. 3 above) to complete the finished packaged electronic device 200 to finish fabrication of a packaged electronic device 200 with a conformal electrical isolation coating layer 222.

Described examples provide a thin conformal coating to facilitate electrical isolation within a packaged electronic device, which can be easily and cost-effectively applied to the backside of a silicon or other semiconductor wafer during wafer processing. Certain examples provide layers that are thin enough to provide good electrical isolation but thin enough to not have any significant negative impact on thermal impedance. A variety of different suitable electrical isolation coating layer materials can be used, including without limitation parylene, low temperature $SiO_2$, etc. applied with processes like low temp CVD, VDP, atomic layer deposition (ALD), electro-static spray coating, etc. This allows the use of thermally conductive die attach materials (e.g., adhesive 130, 230 above). A step cut process in certain implementations allows the conformal coat to be applied to the back side and side walls of the die to provide isolation on all interfaces between the conductive die attach adhesive material 130 and the silicon of the semiconductor die 110. The addition of a recess feature or half etch trench on the die attach pad 107 around the periphery of the semiconductor die 110 can reduce the die attach fillet height while providing higher bond line thickness (BLT) on the high stress die corners and/or periphery of the semiconductor die 110 to enhance system-level performance and further enhance process margin for assembly and reliability. The disclosed examples do not require changes or reengineering of the die attach adhesive 130, and thus facilitate scaling using proven conductive die attach materials to large and small die sizes without the constraints and challenges from bonding operations using other non-conductive die attach materials. Moreover, the described solutions do not increase the package size as is the case with stacked die arrangements. In addition, the described examples can facilitate thermal performance of the finished packaged electronic device without the need for thick non-conductive die attach materials and/or dielectrics, and without introducing significant additional manufacturing cost or complexity, while supporting higher voltage isolation along with good thermal performance.

Modifications are possible in the described examples, and other implementations are possible, within the scope of the claims.

What is claimed is:

1. An electronic device, comprising:

a semiconductor die having opposite first and second sides, a conductive terminal on the second side, and a high thermal conductivity electrical isolation coating layer that extends on the first side;

a die attach pad;

an adhesive that adheres the first side of the semiconductor die to the die attach pad;

a conductive lead electrically coupled to the conductive terminal of the semiconductor die; and a package structure that encloses at least a portion of the semiconductor die.

2. The electronic device of claim 1, wherein:

the semiconductor die has a lateral sidewall that extends between the first and second sides and an indent that extends into a portion of the lateral sidewall and to the first side; and the electrical isolation coating layer extends along the indent and on the first side.

3. An electronic device, comprising:

a semiconductor die having opposite first and second sides, a conductive terminal on the second side, a lateral sidewall that extends between the first and second sides, a semiconductor base portion that extends to the first side, an upper semiconductor layer that extends to the second side, and an insulator layer between the semiconductor base portion and the upper semiconductor layer;

an indent that extends into a portion of the lateral sidewall and to the first side and an electrical isolation coating layer that extends along the indent and on the first side, and the indent extends into a portion of the insulator layer; and the electrical isolation coating layer extends on a portion of the insulator layer;

a die attach pad;

an adhesive that adheres the first side of the semiconductor die to the die attach pad;

a conductive lead electrically coupled to the conductive terminal of the semiconductor die; and a package structure that encloses at least a portion of the semiconductor die.

4. The electronic device of claim 2, wherein the electrical isolation coating layer includes at least one of silicon dioxide, parylene, and polyimide.

5. The electronic device of claim 2, wherein the electrical isolation coating layer has a thickness of approximately 0.1 μm or more and approximately 10 μm or less.

6. The electronic device of claim 5, wherein the electrical isolation coating layer has a thickness of approximately 2 μm or more and approximately 5 μm or less.

7. The electronic device of claim 1, wherein the electrical isolation coating layer includes at least one of silicon dioxide, parylene, and polyimide.

8. The electronic device of claim 1, wherein the electrical isolation coating layer has a thickness of approximately 0.1 μm or more and approximately 10 μm or less.

9. The electronic device of claim 8, wherein the electrical isolation coating layer has a thickness of approximately 2 μm or more and approximately 5 μm or less.

10. A system, comprising: a circuit board; and an electronic device having a die attach pad, a conductive lead, a semiconductor die, an adhesive, and a package structure, wherein: the semiconductor die has opposite first and second sides, a conductive terminal on the second side, and an electrical isolation coating layer that extends on the first side; the adhesive adheres the first side of the semiconductor die to the die attach pad; the conductive lead is electrically coupled to the conductive terminal of the semiconductor die and to a conductive feature of the circuit board; and the package structure encloses at least a portion of the semiconductor die;

the semiconductor die has a lateral sidewall that extends between the first and second sides and an indent that extends into a portion of the lateral sidewall and to the first side; and the electrical isolation coating layer extends along the indent and on the first side.

11. The system of claim 10, wherein the electrical isolation coating layer has a high thermal conductivity.

12. The system of claim 10, wherein the electrical isolation coating layer includes at least one of silicon dioxide, parylene, and polyimide.

13. The system of claim 10, wherein the electrical isolation coating layer has a thickness of approximately 0.1 μm or more and approximately 10 μm or less.

14. A method of fabricating an electronic device, the method comprising:

forming trenches in a first side of a wafer;

forming an electrical isolation coating layer on the first side and in the trenches;

separating a semiconductor die from the wafer, the semiconductor die having a portion of the first side, an opposite second side, a conductive terminal on the second side, a lateral sidewall that extends between the first and second sides, an indent that extends into a portion of the lateral sidewall and to the portion of the first side, and a portion of the electrical isolation coating layer that extends along the indent and on the portion of the first side; and attaching the semiconductor die to a die attach pad with an adhesive that extends into a half-etch indent in the die attach pad to control adhesive flow and fillet height of the adhesive along the indent of the semiconductor die.

15. The method of claim 14, wherein forming the electrical isolation coating layer includes performing a deposition process that deposits the electrical isolation coating layer on the first side and in the trenches.

16. The method of claim 14, wherein forming the electrical isolation coating layer includes forming at least one of silicon dioxide, parylene, and polyimide on the first side and in the trenches.

17. The method of claim 14, wherein forming the electrical isolation coating layer includes forming the electrical isolation coating layer to a thickness of approximately 0.1 μm or more and approximately 10 μm or less on the first side and in the trenches.

18. The system of claim 10, wherein the electrical isolation coating layer has a high thermal conductivity.

19. The system of claim 10, wherein the electrical isolation coating layer includes at least one of silicon dioxide, parylene, and polyimide.

20. The system of claim 10, wherein the electrical. isolation coating layer has a thickness of approximately 0.1 μm or more and approximately 10 μm or less.

* * * * *